United States Patent
Chen et al.

(10) Patent No.: US 11,749,526 B2
(45) Date of Patent: Sep. 5, 2023

(54) SEMICONDUCTOR SUBSTRATE AND METHOD OF MANUFACTURING THEREOF

(71) Applicant: TAIWAN SEMICONDUCTOR MANUFACTURING COMPANY, LTD., Hsinchu (TW)

(72) Inventors: I-Sheng Chen, Taipei (TW); Tzu-Chiang Chen, Hsinchu (TW); Cheng-Hsien Wu, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 0 days.

(21) Appl. No.: 17/873,122

(22) Filed: Jul. 25, 2022

(65) Prior Publication Data

US 2022/0367174 A1 Nov. 17, 2022

Related U.S. Application Data

(62) Division of application No. 16/006,375, filed on Jun. 12, 2018.

(Continued)

(51) Int. Cl.
*H01L 21/02* (2006.01)
*C30B 29/06* (2006.01)
(Continued)

(52) U.S. Cl.
CPC .......... *H01L 21/0243* (2013.01); *C30B 29/06* (2013.01); *C30B 29/08* (2013.01);
(Continued)

(58) Field of Classification Search
CPC . H01L 29/161; H01L 29/165; H01L 21/0243; H01L 21/02433; H01L 21/02538; H01L 21/0245; C30B 29/06; C30B 29/08
See application file for complete search history.

(56) References Cited

U.S. PATENT DOCUMENTS 9,525,105 B2 * 12/2016 Shimooka ........... H01L 21/0254
9,558,943 B1    1/2017 Pawlak
(Continued)

FOREIGN PATENT DOCUMENTS

CN 102130224 A 7/2011
CN 102347352 A 2/2012
(Continued)

OTHER PUBLICATIONS

Non-Final Office Action issued in U.S. Appl. No. 16/006,375, dated May 6, 2020.
(Continued)

*Primary Examiner* — Phat X Cao
(74) *Attorney, Agent, or Firm* — McDermott Will & Emery LLP

(57) ABSTRACT

A semiconductor substrate includes a first material layer made of a first material and including a plurality of protrusions, and a second material layer made of a second material different from the first material, filling spaces between the plurality of protrusions, and covering the plurality of protrusions. Each of the protrusions includes a tip and a plurality of facets converging at the tip, and adjacent facets of adjacent protrusions are in contact with each other.

20 Claims, 29 Drawing Sheets

Related U.S. Application Data

(60) Provisional application No. 62/565,376, filed on Sep. 29, 2017.

(51) Int. Cl.

| | | |
|---|---|---|
| *C30B 29/08* | (2006.01) | |
| *C30B 29/66* | (2006.01) | |
| *C30B 33/02* | (2006.01) | |
| *C30B 33/10* | (2006.01) | |
| *H01L 21/306* | (2006.01) | |
| *H01L 21/308* | (2006.01) | |

(52) U.S. Cl.
CPC .............. *C30B 29/66* (2013.01); *C30B 33/02* (2013.01); *C30B 33/10* (2013.01); *H01L 21/0254* (2013.01); *H01L 21/02381* (2013.01); *H01L 21/02433* (2013.01); *H01L 21/02455* (2013.01); *H01L 21/02538* (2013.01); *H01L 21/02543* (2013.01); *H01L 21/02546* (2013.01); *H01L 21/02549* (2013.01); *H01L 21/02694* (2013.01); *H01L 21/3083* (2013.01); *H01L 21/30608* (2013.01); *H01L 21/0245* (2013.01); *H01L 21/02532* (2013.01)

(56) References Cited

U.S. PATENT DOCUMENTS

| | | | |
|---|---|---|---|
| 9,608,115 B2 * | 3/2017 | Xiao | .................... H01L 27/0886 |
| 2005/0042789 A1 | 2/2005 | Fujikura et al. | |
| 2007/0004123 A1 | 1/2007 | Bohr et al. | |
| 2011/0049568 A1 | 3/2011 | Lochtefeld et al. | |
| 2011/0198560 A1 | 8/2011 | Okagawa et al. | |
| 2014/0319657 A1 | 10/2014 | Li et al. | |
| 2015/0048380 A1 | 2/2015 | Koike et al. | |
| 2015/0076505 A1 | 3/2015 | Ke et al. | |
| 2017/0062658 A1 | 3/2017 | Shimooka | |
| 2018/0350590 A1 | 12/2018 | Wu et al. | |
| 2019/0040546 A1 | 2/2019 | Noguchi et al. | |

FOREIGN PATENT DOCUMENTS

| | | | |
|---|---|---|---|
| CN | 106356284 A | 1/2017 | |
| JP | 2014-067748 A | 4/2014 | |
| JP | 2017-137201 A | 8/2017 | |
| KR | 10-2008-0015891 A | 2/2008 | |
| KR | 101052637 B1 | 7/2011 | |
| TW | 201421730 A | 6/2014 | |
| TW | 201703152 A | 1/2017 | |

OTHER PUBLICATIONS

Final Office Action issued in U.S. Appl. No. 16/006,375, dated Oct. 9, 2020.
Non-Final Office Action issued in U.S. Appl. No. 16/006,375, dated Jan. 11, 2021.
Final Office Action issued in U.S. Appl. No. 16/006,375, dated Jun. 1, 2021.
Non-Final Office Action issued in U.S. Appl. No. 16/006,375, dated Oct. 13, 2021.
Final Office Action issued in U.S. Appl. No. 16/006,375, dated Mar. 3, 2022.
Non-Final Office Action issued in U.S. Appl. No. 16/006,375, dated Jun. 10, 2022.
Final Office Action issued in U.S. Appl. No. 16/006,375, dated Oct. 31, 2022.

* cited by examiner

SEMICONDUCTOR SUBSTRATE AND METHOD OF MANUFACTURING THEREOF

PRIORITY CLAIM AND CROSS-REFERENCE

This application is a Divisional application of U.S. application Ser. No. 16/006,375, filed on Jun. 12, 2018, which claims priority to U.S. Provisional Application No. 62/565,376 filed on Sep. 29, 2017, entitled "LATTICE-MISMATCHED SEMICONDUCTOR SUBSTRATE AND METHOD OF MANUFACTURING THEREOF," the entire disclosures of each of which are incorporated herein by reference.

BACKGROUND

As compared to silicon, germanium provides higher electron and hole mobilities and has a lower bandgap. Thus, semiconductor devices made of germanium can have a faster speed and consume less power, as compared to semiconductor devices made of silicon. However, germanium wafers having a size of more than 2 inches are usually not available. One alternative to a germanium wafer is to grow a germanium layer on a base substrate or a support substrate, such that a size of the germanium layer can be the same as the size of the base substrate on which the germanium layer is grown. In a case in which a large size base substrate, for example, a 12-inch silicon wafer, is used to grow a germanium layer, the germanium layer can have a 12-inch size compatible with mass-production semiconductor manufacturing equipment. However, due to lattice mismatch between a general silicon wafer having a planarized surface and a germanium layer grown thereon, a threading dislocation defect (TDD) level is high, which deteriorates performance of the semiconductor devices made of the germanium layer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
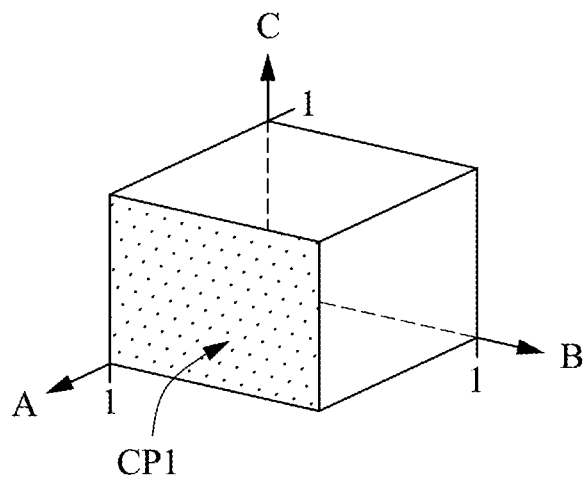
FIG. 1A shows a crystal plane of silicon.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the structure in use or operation in addition to the orientation depicted in the figures. The structure may be otherwise oriented (rotated 90 degrees or at other orientations) and the spatially relative descriptors used herein may likewise be interpreted accordingly.

It should be understood that in the present disclosure, one pattern/layer/structure/surface/direction being substantially perpendicular to another pattern/layer/structure/surface/direction means that the two patterns/layers/structures/surfaces/directions are perpendicular to each other, or the two patterns/layers/structures/surfaces/directions are intended to be configured to be perpendicular to each other but may not be perfectly perpendicular to each other due to design, manufacturing, measurement errors/margins caused by unperfected or undesirable design, manufacturing, and measurement conditions.

It should be understood that in the present disclosure, one pattern/layer/structure/surface/direction being substantially parallel to another pattern/layer/structure/surface/direction means that the two patterns/layers/structures/surfaces/directions are parallel to each other, or the two patterns/layers/structures/surfaces/directions are intended to be configured to be parallel to each other but may not be perfectly parallel to each other due to design, manufacturing, measurement errors/margins caused by unperfected or undesirable design, manufacturing, and measurement conditions.

In the present disclosure, "about" or "approximately" used to describe a value of a parameter means that the parameter is equal to the described value or that the parameter is within a certain range of the described value, when design error/margin, manufacturing error/margin, measurement error etc. are considered. Such a description should be recognizable to one of ordinary skill in the art.

In accordance with various embodiments, the present disclosure is generally related to lattice-mismatched semiconductor substrates having hetero-structures and manufacturing methods thereof. The semiconductor substrates according to some embodiments can be used to manufacture semiconductor devices including, but not limited to, planar field effect transistors (FET), fin FETs (FinFETs), and gate-all-around (GAA) FETs or lateral nanowire FETs. In a case in which the semiconductor substrates are used to manufacture FinEFTs, the fins may be patterned by any suitable method. For example, the fins may be patterned in a semiconductor substrate using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In a case in which the semiconductor substrates are used to manufacture GAA FETs, the structures of the GAA FETs may be patterned in a semiconductor substrate by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Silicon substrates, which have been widely used as substrates in manufacturing semiconductor devices or integrated circuits, are made of single crystal silicon. One of ordinary skill in the art should understand that semiconductor substrates used in this application should not be limited to silicon substrates/wafers to be described below as an example. In other embodiments, the semiconductor substrate/wafer can include, or consist essentially of, other semiconductor materials such as germanium or Group III-V semiconductor materials.

Figure 1B:
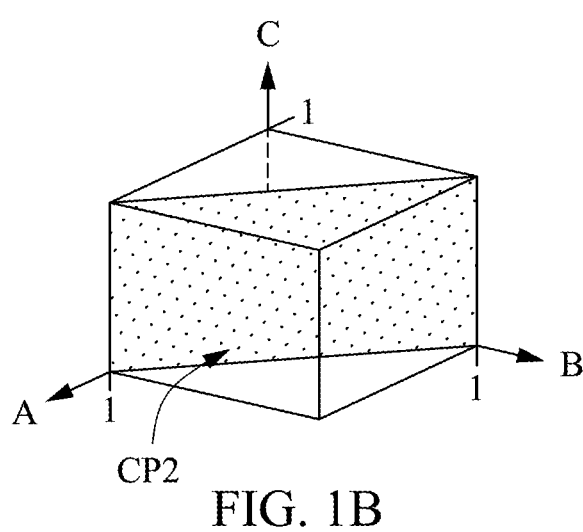
FIG. 1B shows a crystal plane of silicon.
Figure 1C:
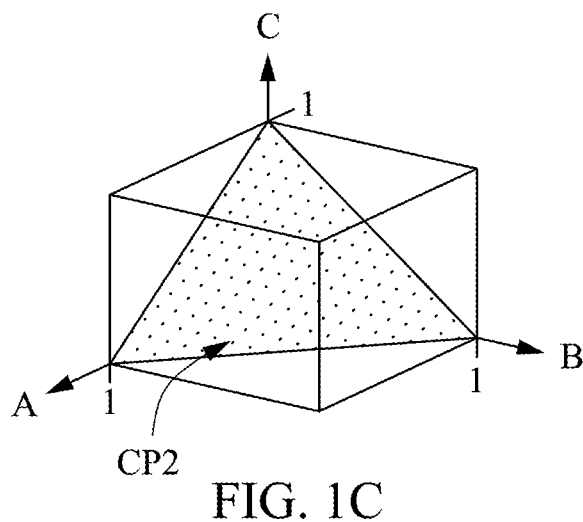
FIG. 1C shows a crystal plane of silicon.

FIGS. 1A-1C show three orientations of crystal planes of a single crystal material including a Group IV material, such as silicon.

In crystalline silicon, atoms which make up the solid are arranged in a periodic fashion. If the periodic arrangement exists throughout the entire solid, the substance is defined as being formed of a single crystal. If the solid is composed of a myriad of single crystal regions, the solid is referred to as polycrystalline material. The periodic arrangement of atoms in a crystal is commonly called "the lattice." The crystal lattice also contains a volume which is representative of the entire lattice and is referred to as a unit cell that is regularly repeated throughout the crystal. For example, silicon has a diamond cubic lattice structure, which can be represented as two interpenetrating face-centered cubic lattices. Thus, the simplicity of analyzing and visualizing cubic lattices can be extended to the characterization of silicon crystals. In the description herein, references to various planes in silicon crystals will be made, especially to the (100), (110), and (111) planes. These planes define the orientation of the plane of silicon atoms relative to the principle crystalline axes. The numbers (abc) are referred to as Miller indices and are determined from the reciprocals of the points at which the crystal plane of silicon intersects the principal crystalline axes.

In FIG. 1A, a crystal plane CP1 of silicon intersects A-axis at a unit distance and does not intersect B-axis or C-axis. Therefore, the orientation of this type of crystalline silicon is denoted as (100). In FIG. 1B, a crystal plane CP2 of silicon intersects A-axis and B-axis at a unit distance and does not intersect C-axis. Therefore, the orientation of this type of crystalline silicon is denoted as (110). In FIG. 1C, a crystal plane CP3 of silicon intersects A-axis, B-axis, and C-axis at a unit distance. Therefore, the orientation of this type of crystalline silicon is denoted as (111).

Notably, for any given plane in a cubic crystal there are five other equivalent planes. Thus, the six sides of the cube comprising the basic unit cell of the crystal are all considered (100) planes. The notation {abc} refers to all six of the equivalent (abc) planes. Throughout the description, reference will also be made to the crystallographic directions, such as the [100], [110] and [111] directions. These are defined as the normal direction to the respective plane. For example, the [100] direction is the direction normal to the (100) plane. Similarly, for any given crystallographic directions there are five other equivalent directions. The notation <abc> refers to all six equivalent directions.

The above description uses silicon as an example. The present disclosure should not be limited thereto. One of ordinary skill in the art should understand that signal crystal material also refer to germanium or any of Group III-V semiconductor materials.

Figure 2:
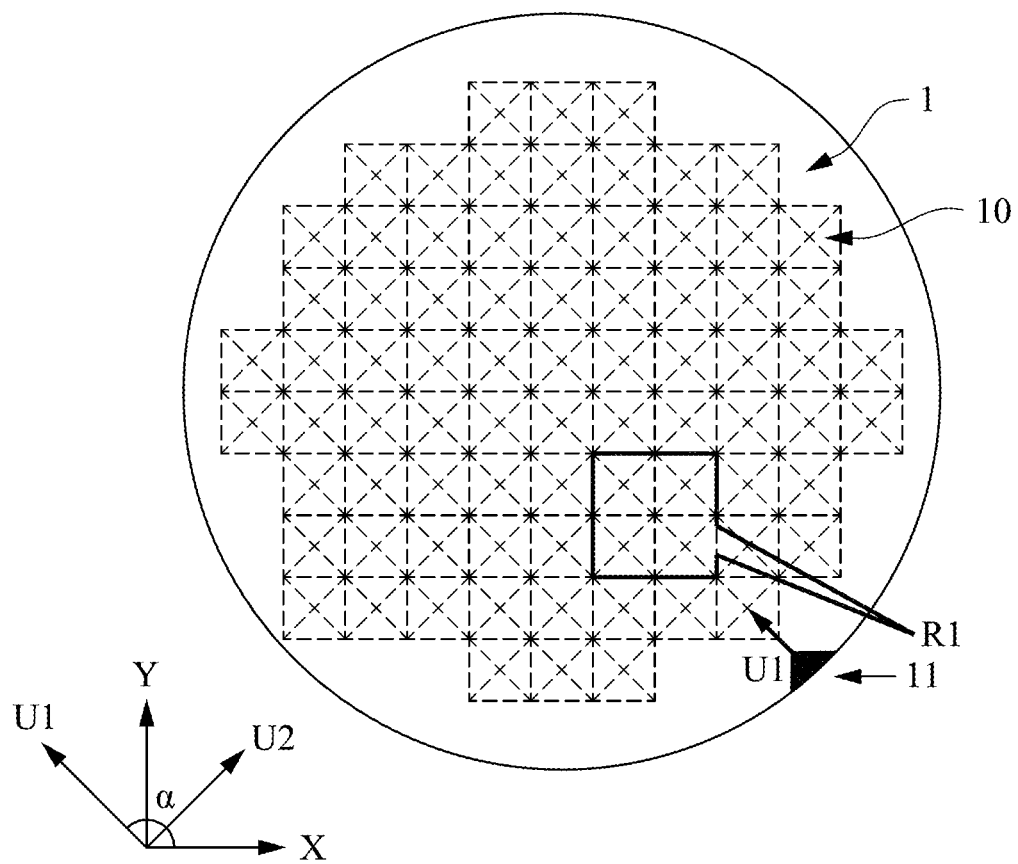
FIG. 2 shows a plan view of a semiconductor substrate according to embodiments of the present disclosure.

FIG. 2 is a plan view of a semiconductor substrate according to embodiments of the present disclosure.

Referring to the drawings, a semiconductor substrate according to embodiments of the present disclosure includes a base layer 1, an interlayer 2 disposed on the base layer 1, and an upper layer 3 disposed on the interlayer 2.

The semiconductor substrate can act as a substrate, based on which semiconductor devices (not shown) or integrated circuits (not shown) can be manufactured by a series of semiconductor manufacturing processes including, but not limited to, oxidation, lithography, etching, deposition of thin films such as metal or dielectric films, and planarization such as chemical-mechanical polishing (CMP).

Referring to the drawings, in some embodiments, the base layer 1 is a crystal material having crystal lattice the same as or similar to those shown in FIGS. 1A-1C. In some embodiments, the base layer 1 is crystal semiconductor such as single crystal silicon. In some embodiments, the base layer 1 is a device layer of a silicon-on-insulator (SOI) wafer, although an oxide layer and a handle layer of the SOI wafer are not shown in the drawings. In some embodiments, the device layer of the SOI wafer is made of crystal semiconductor such as single crystal silicon. In some embodiments, the base layer 1 is crystal semiconductor such as single crystal silicon disposed on one or more layers (not shown) which can be made of an amorphous or polycrystalline material or made of another signal crystal material (not shown) different from the material forming the base layer 1. The present disclosure, however, is not limited thereto.

Referring to FIG. 2, the base layer 1 has a wafer shape including a notch 11, according to some embodiments. In a plan view defined by an X-Y coordinate system (in which X axis and Y axis are perpendicular to each other), a crystallographic direction U1 of the base layer 1, i.e., a direction from the notch 11 to the center of the base layer 1 or a direction along a diameter direction passing through the notch 11, is crystallographic direction <110> or substantially parallel to crystallographic direction <110>, and a crystallographic direction U2 of the base layer 1 passing through the notch 11 and perpendicular to the crystallographic direction U1 is another crystallographic direction <110> or substantially parallel to another crystallographic direction <110>, according to some embodiments. In some embodiments, the base layer 1 having {100} plane parallel to or substantially parallel to a plane defined by the X-Y coordinate system.

According to some embodiments, an angle α between X axis and the crystallographic direction U1 is about 135° (or about 45°, a complementary angle of 135°). In other embodiments, the angle α between X axis and the crystallographic direction U1 is about 125° to about 145° (or about 35°, a complementary angle of 145°, to about 55°, a complementary angle of 125°). The present disclosure is not limited thereto.

Referring to FIG. 2, the base layer 1 includes a plurality of protrusions 10 arranged in an array, according to some embodiments. Edges (or boundaries) of the plurality of protrusions 10 are substantially parallel to X axis or Y axis, according to embodiments.

Figure 3:
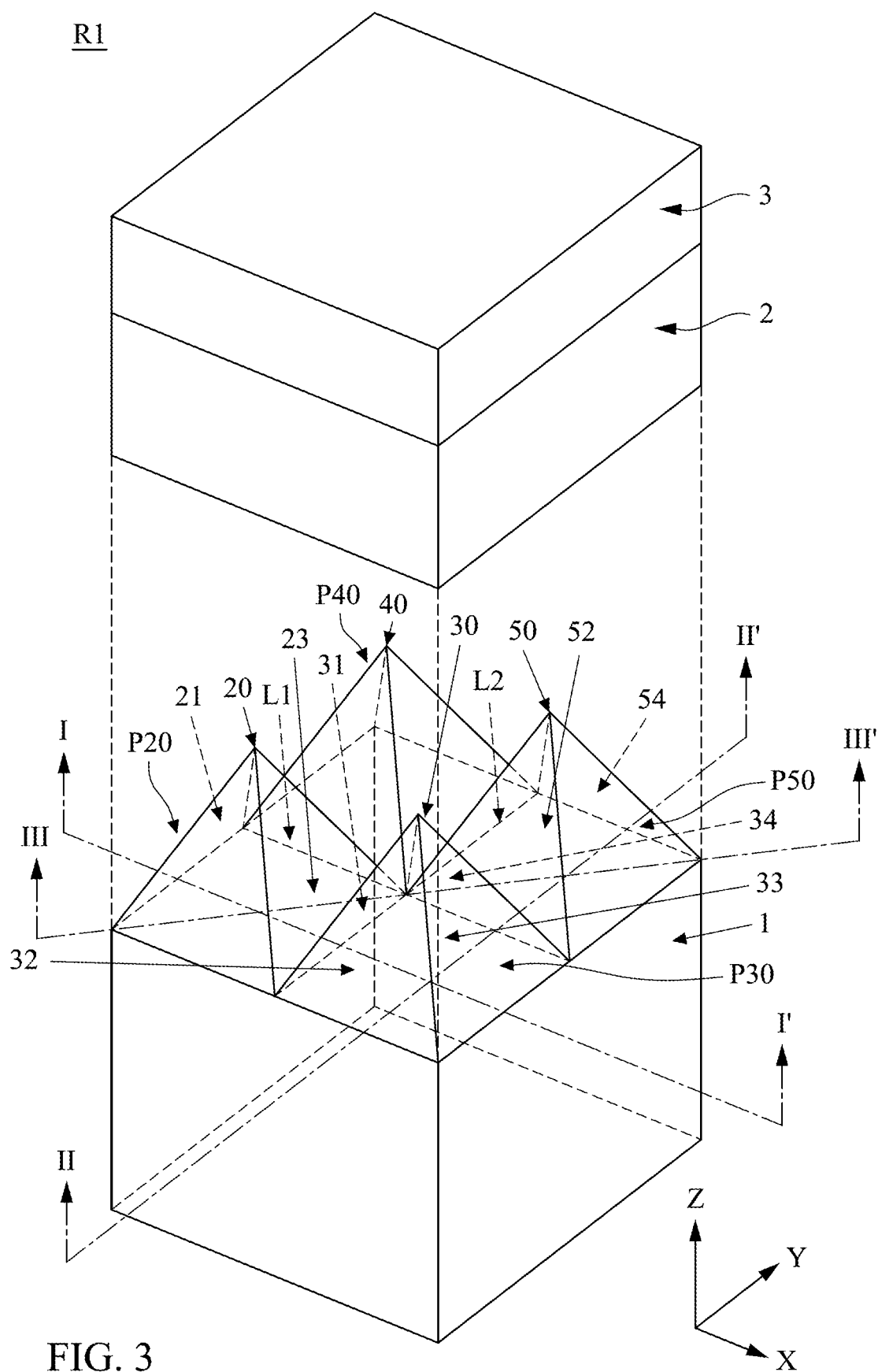
FIG. 3 shows an exploded three-dimensional view of protrusions located in a region R1 of the semiconductor substrate shown in FIG. 2.
Figure 4:
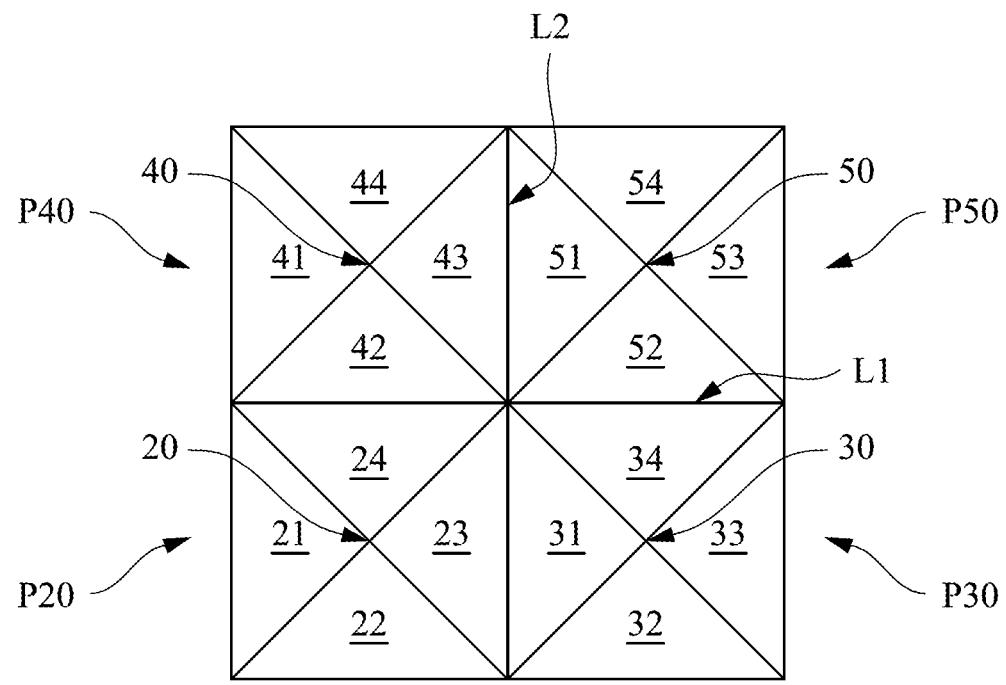
FIG. 4 shows a plan view of a base layer in the region R1 of the semiconductor substrate.
Figure 4:
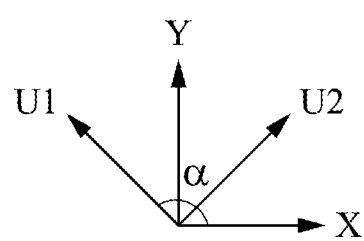
Figure 5:
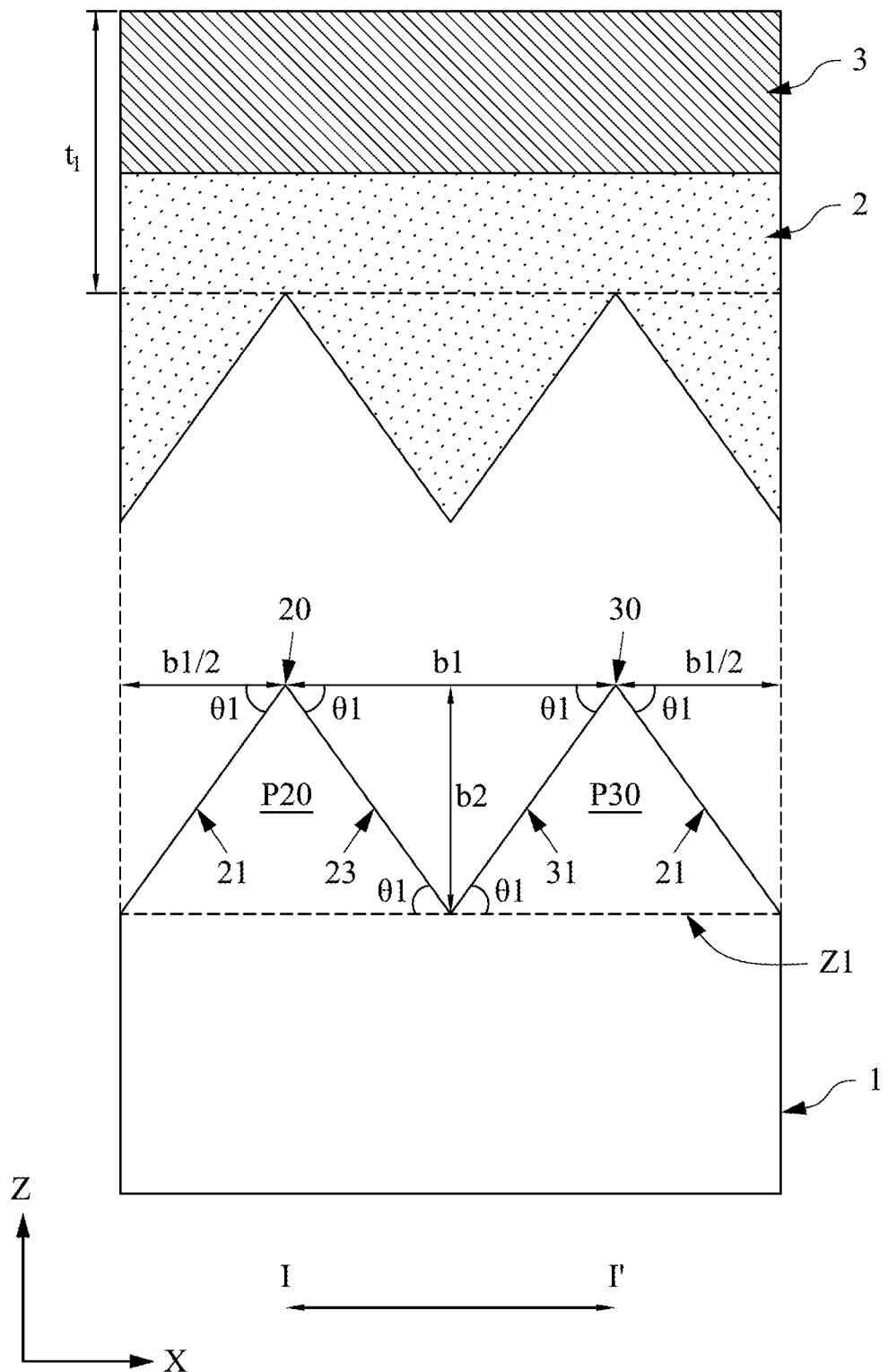
FIG. 5 shows a cross-sectional view of the region R1 of the semiconductor substrate taken along line I-I' shown in FIG. 3.
Figure 6:
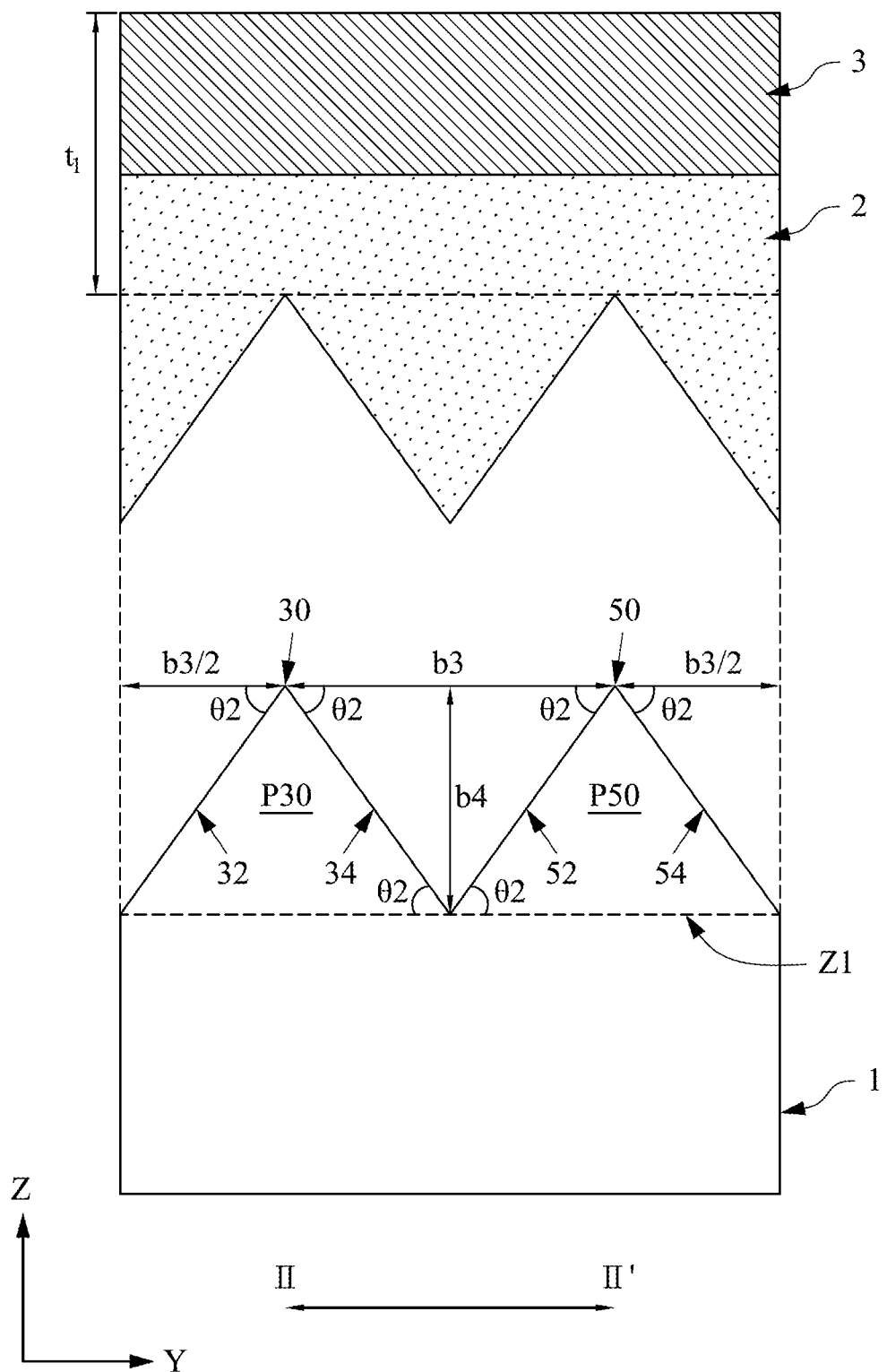
FIG. 6 shows a cross-sectional view of the region R1 of the semiconductor substrate taken along line II-II' shown in FIG. 3.
Figure 7:
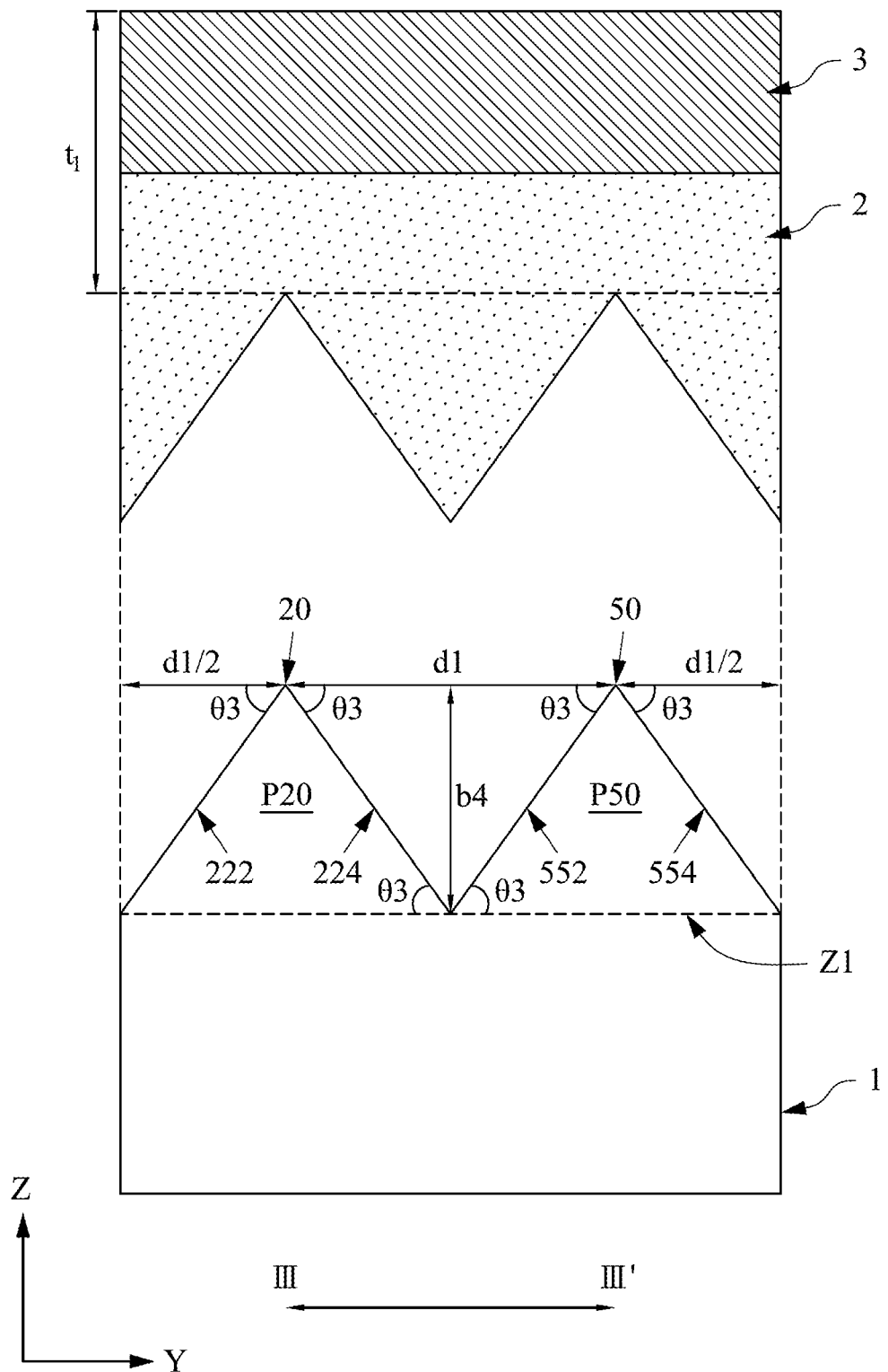
FIG. 7 shows a cross-sectional view of the region R1 of the semiconductor substrate taken along line III-III' shown in FIG. 3.

FIG. 3 shows an exploded three-dimensional view of protrusions including first to fourth protrusions P20, P30, P40, and P50 of the plurality of protrusions 10, located in a region R1 of the semiconductor substrate shown in FIG. 2. FIG. 4 is a plan view of the base layer 1 in the region R1 of the semiconductor substrate. FIG. 5 is a cross-sectional view of the region R1 of the semiconductor substrate taken along line I-I' shown in FIG. 3. FIG. 6 is a cross-sectional view of the region R1 of the semiconductor substrate taken along line II-IF shown in FIG. 3. FIG. 7 shows a cross-sectional view of the region R1 of the semiconductor substrate taken along line in a diagonal direction passing through common edges of adjacent facets of the first protrusion P20 and common edges of adjacent facets of the fourth protrusion P50, as shown in FIG. 3.

Referring to the drawings, the first protrusion P20 and the second protrusion P30 are arranged in X axis, the third protrusion P40 and the fourth protrusion P50 are arranged in X axis, the first protrusion P20 and the third protrusion P40 are arranged in Y axis, and the second protrusion P30 and the fourth protrusion P50 are arranged in Y axis. Z axis is an axis perpendicular to X axis and Y axis. In some embodiments, Z axis is along a crystallographic direction <100> or substantially parallel to a crystallographic direction <100>.

The first protrusion P20 has four facets 21 through 24 which converge at a first tip 20, the second protrusion P30 has four facets 31 through 34 which converge at a second tip 30, the third protrusion P40 has four facets 41 through 44 which converge at a third tip 40, and the fourth protrusion P50 has four facets 51 through 54 which converge at a fourth tip 50. The bases of the first to fourth protrusions P20, P30, P40, and P50 are substantially parallel to the X-Y coordinate system in some embodiments, and are represented by a plane Z1 in cross-sectional views shown in FIGS. 5 and 6. In some embodiments, the bases of the first to fourth protrusions P20, P30, P40, and P50 or the plane Z1 coincide {100} plane of the base layer 1. In some embodiments, each protrusion 10 has a pyramid shape and each of the facets thereof has a triangular shape. The present disclosure, however, is not limited thereto.

In some embodiments, adjacent facets of two adjacent protrusions 10 are in contact with each other, such that no {100} plane of the base layer 1 is exposed from the protrusions or between the protrusions 10. In some embodiments, only {111} planes of the base layer 1 (not including a peripheral region of the base layer 1 that surrounds a central region of the base layer 1 in which the protrusions 10 are formed) are in contact with the interlayer 2.

In some embodiments, adjacent two of the first to fourth protrusions P20, P30, P40, and P50 have common edges, at which adjacent facets of the first to fourth protrusions P20, P30, P40, and P50 converge. In some embodiments, the common edges of adjacent two of the first to fourth protrusions P20, P30, P40, and P50 are substantially parallel to the X axis or the Y axis.

For example, a first line L1, which passes through a common edge of the facet 24 of the first protrusion P20 and the facet 42 of the third protrusion P40 or passes through a common edge of the facet 34 of the second protrusion P40 and the facet 52 of the fourth protrusion P50, is parallel to X axis. A second line L2, which passes through a common edge of the facet 23 of the first protrusion P20 and the facet 31 of the second protrusion P30 or passes through a common edge of the facet 43 of the third protrusion P40 and the facet 51 of the fourth protrusion P50, is parallel to Y axis.

In some embodiments, each of the facet of the first to fourth protrusions P20, P30, P40, and P50 is a {111} crystallographic plane. The present disclosure, however, is not limited thereto.

Referring to FIG. 5, a first pitch b1 of the first and second protrusions P20 and P30 in X axis is defined to be a distance between the first tip 20 and the second tip 30 in X axis, and a depth (or height) b2 of the first and second protrusions P20 and P30 is defined to be a distance between the first tip 20 (or the second tip 30) to the base thereof (or the plane Z1) in Z axis. In some embodiments, $$b2 = \frac{\sqrt{2}}{2} b1$$

is satisfied, and in this case, a first angle θ1 between the facet 23 (or 31) and the base of the first (or second) protrusion P20 (or P30) is about 54.7°. The present disclosure should not be limited thereto. In other embodiments, the first angle θ1 is about 45° to about 59°, due to process variations during manufacturing.

In some embodiments, the first pitch b1 is about 50 nm to about 1000 nm. The present disclosure is not limited thereto, and the first pitch b1 can be modified according to design particulars.

Referring to FIG. 6, a second pitch b3 of the second and fourth protrusions P30 and P50 in Y axis is defined to be a distance between the second tip 30 and the fourth tip 50 in Y axis, and a depth (or height) b4 of the second and fourth protrusions P30 and P50 is defined to be a distance between the second tip 30 (or the fourth tip 50) to the base thereof (or the plane Z1) in Z axis. In some embodiments, $$b4 = \frac{\sqrt{2}}{2} b3$$

is satisfied, and in this case, a second angle θ2 between the facet 34 (or 52) and the base of the second (or fourth) protrusion P30 (or P50) is about 54.7°. The present disclosure should not be limited thereto. In other embodiments, the second angle θ2 is about 45° to about 59°, due to process variations during manufacturing. In some embodiments, the first angle θ1 and the second angle θ2 are the same or substantially the same as each other. In other embodiments, the first angle θ1 and the second angle θ2 are substantially different from each other.

In some embodiments, the second pitch b3 is about 50 nm to about 1000 nm. The present disclosure is not limited thereto, and the second pitch b3 can be modified according to design particulars. In some embodiments, the first pitch b1 and the second pitch b2 are equal to each other. In other embodiments, the first pitch b1 and the second pitch b2 can be different from each other.

Referring to FIG. 7, a diagonal pitch d1 of the first and fourth protrusions P20 and P50 in a diagonal direction is √2·b1, in a case in which the first pitch b1 is equal to the second pitch b3. Thus, a third angle θ3 between a common edge 224 or 222 of two facets of the first protrusion P20 (or a common edge 552 or 554 of two facets of the fourth protrusion P50) and the base of the first (or fourth) protrusion P20 (or P50) is about 45°. The present disclosure should not be limited thereto. In other embodiments, the third angle θ3 is about 35° to about 55°, due to process variations during manufacturing.

Referring to FIGS. 2, 3, and 5-7, the semiconductor substrate further includes the interlayer 2 disposed on the base layer 1, filling spaces between adjacent protrusions 10 of the base layer 1, and covering the tips of the plurality of protrusions 10 of the base layer 1, and the upper layer 3 disposed on the interlayer 2.

According to some embodiments, the interlayer 2 is made of a material different from that used to form the base layer 1 and is directly formed on the base layer 1. The interlayer 2 has a structure complementary to the plurality of protrusions 10, such that the interlayer 2 and the base layer 1 form a hetero-structure having a hetero-junction at the interfaces therebetween.

According to some embodiments, the upper layer 3 is directly formed on the interlayer 2. In some embodiments, the interlayer 2 and the upper layer 3 are made of the same material. In some embodiments, the semiconductor substrate further includes additional one or more layers (not shown) between the interlayer 2 and the upper layer 3. The additional one or more layers, if included, have planarized surfaces contacting adjacent layers and are made of the same material used to form the interlayer 2 and the upper layer 3.

According to some embodiments, the material for forming the base layer 1 can include, or consist essentially of, a group II, a group III, a group IV, a group V, and/or a group VI element, and/or compounds thereof, for example, selected from the group consisting of silicon, germanium, silicon germanium, gallium arsenide, aluminum antimonide, indium aluminum antimonide, indium antimonide, indium arsenide, indium phosphide, and gallium nitride. According to some embodiments, the material for forming the interlayer 2 and thereabove of the semiconductor substrate is different from that used to form the base layer 1 and can include, or consist essentially of, a group II, a group III, a group IV, a group V, and/or a group VI element, and/or compounds thereof, for example, selected from the group consisting of silicon, germanium, silicon germanium, gallium arsenide, aluminum antimonide, indium aluminum antimonide, indium antimonide, indium arsenide, indium phosphide, and gallium nitride.

According to some embodiments, in a case in which the base layer 1 includes, or consists essentially of, silicon, the interlayer 2 and the upper 3 include, or consist essentially of, germanium. The present disclosure, however, is not limited thereto.

In some embodiments, impurities are doped in the interlayer 2 and the other layer(s) thereabove of the semiconductor substrate, such that the upper portion of the semiconductor substrate is N-type or P-type suitable to manufacture semiconductor devices or integrated circuits.

In other embodiments, the interlayer 2 and the other layer(s) thereabove of the semiconductor substrate are intrinsic. In this case, the upper portion of the semiconductor substrate can be doped impurities to convert the upper portion of the semiconductor substrate to N-type or P-type during manufacturing semiconductor devices or integrated circuits.

According to some embodiments, the layers of the semiconductor substrate including the interlayer 2 and thereabove are made of the same material, but by different processes. In some embodiments, different processes include the same processing condition (i.e., the same recipe) but separately performed, so as to allow another process including, but not limited to, planarization such as CMP, to be performed between the different processes. In other embodiments, different processes mean different growing recipes, regardless of whether different recipes are sequentially performed with or without another process therebetween. In some embodiments, the epitaxial layers of the semiconductor substrate including the interlayer 2 and thereabove are integrated with each other, such that a boundary therebetween is not apparent, even if examined by, for example, a scanning electron microscope (SEM) or a transmission electron microscope (TEM). In other embodiments, some of the layers of the semiconductor substrate including the interlayer 2 and thereabove are integrated with each other but with an interface therebetween which is distinguishable if examined by, for example, an SEM or a TEM. A thickness $t_1$ of the material for forming the interlayer 2 and thereabove, determined from the tips of the plurality of protrusions 10 to an exterior surface of the semiconductor substrate, is about 100 nm to about 2000 nm according to some embodiments, although the present disclosure is not limited thereto.

As described above, the base layer 1 includes the plurality of protrusions 10 having facets which are {111} crystallographic planes, and a material grown on the base layer 1, i.e., directly on the {111} crystallographic planes of the base layer 1, to form the interlayer 2 and thereabove is different from the material for forming the base layer 1. Thus, lattice mismatch exists at the interfaces of the base layer 1 and the interlayer 2.

Since the interfaces between the base layer 1 and the interlayer 2 are substantially {111} crystallographic planes, dislocations, if existing in the interlayer 2, due to the lattice mismatch arise from {111} crystallographic planes, mainly propagate along <110> directions and between the {111} crystallographic planes of two adjacent protrusions 10, according to some embodiments. The dislocation propagation pattern is termed as "Taylor pattern." The Taylor pattern helps releasing the strain between lattice mismatched semiconductor layers and restraining dislocations inside a region interposed between two {111} crystallographic planes. In this case, dislocations, if existing in the interlayer 2, are restrained substantially in the space between adjacent protrusions 10. Accordingly, dislocations, if existing in the interlayer 2, will not propagate into space above the tips of the plurality of protrusions 10. In some embodiments, if dislocations exist in the interlayer 2 and propagate into the spaces above the tips of the plurality of protrusions 10, the number of such dislocations is significantly smaller than the number of those dislocations restrained in the spaces between adjacent protrusions 10. Accordingly, the upper portion of the interlayer 2 is substantially free of dislocations. Thus, the upper layer 3 grown on the interlayer 2 is also substantially free of dislocations, allowing semiconductor devices or integrated circuits to be formed thereon or therein to have enhanced performance.

In some embodiments, the upper layer 3 can be omitted. In this case, the semiconductor substrate includes the base layer 1 and the layer 2 made of a material having a lattice constant different from that of the base layer 1. Accordingly, the layer 2 is an exterior layer of the semiconductor substrate, and semiconductor devices or integrated circuits can be manufactured in or on the upper portion of the layer 2.

Figure 8:
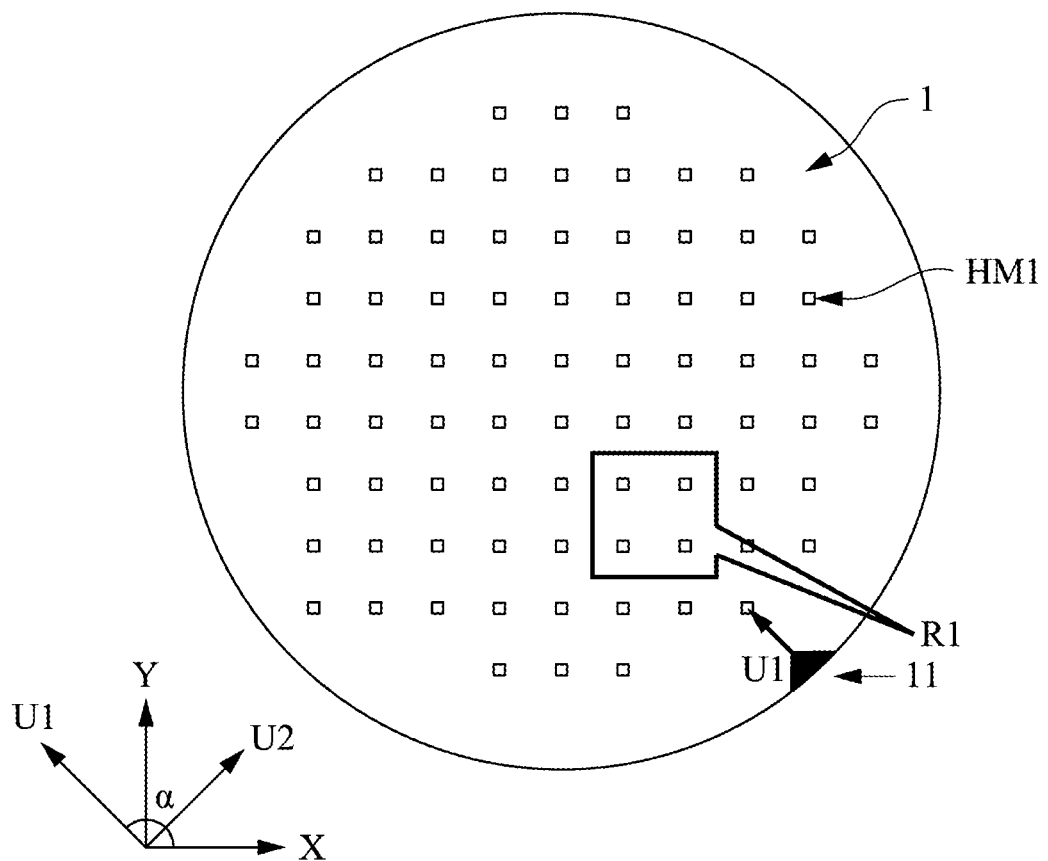
FIG. 8 shows a plan view of an etching mask layer used to manufacture a plurality of protrusions embedded in a semiconductor substrate, according to embodiments of the present disclosure.
Figure 9:
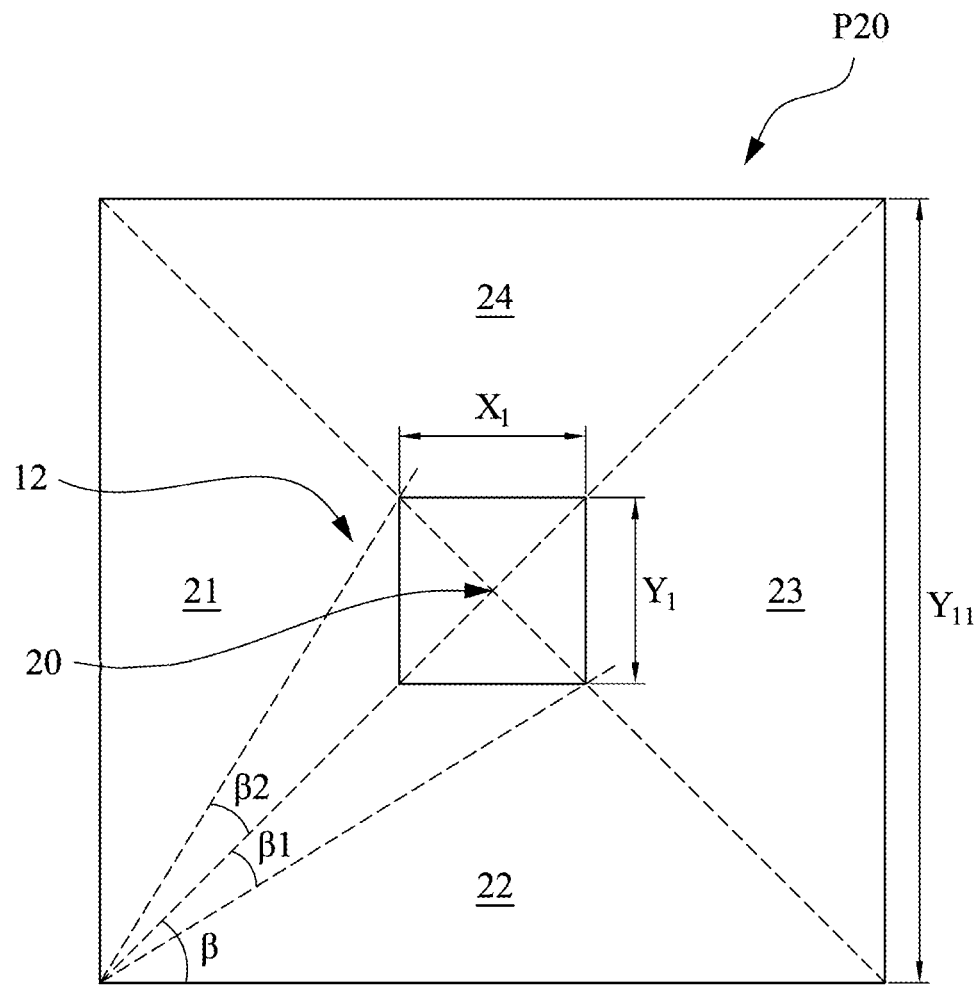
FIG. 9 shows a plan view of a pattern of the etching mask layer used to etch a protrusion and dimensions of the pattern shown in FIG. 8.
Figure 9:
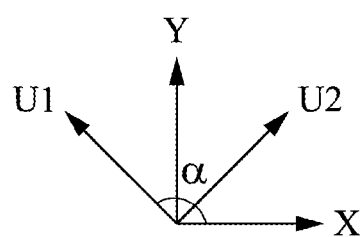
Figure 10:
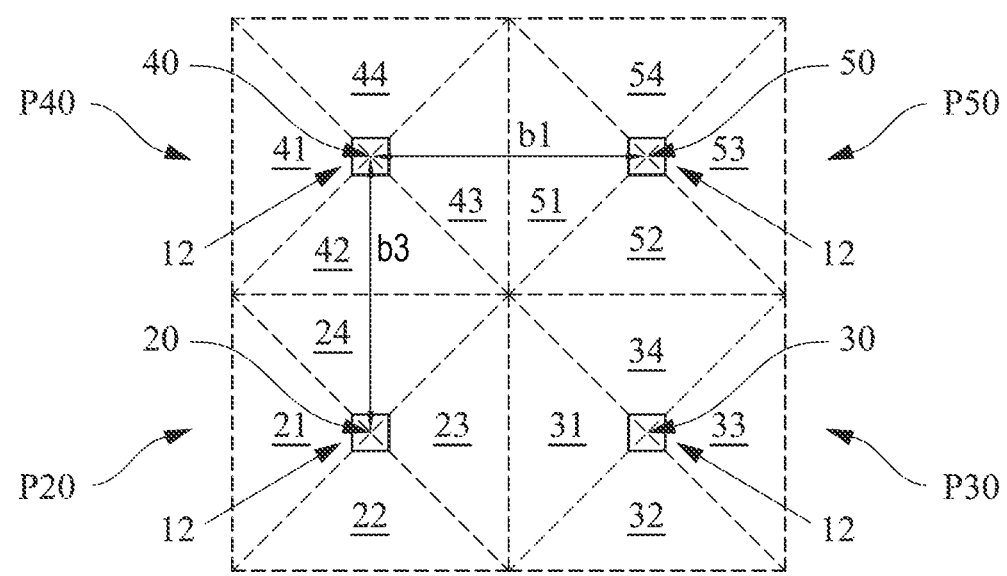
FIG. 10 shows a plan view of the patterns of the etching mask layer in the region R1 shown in FIG. 8.
Figure 10:
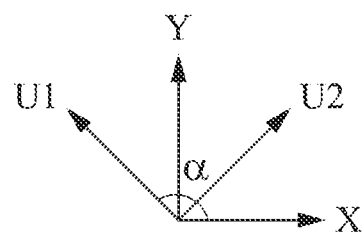

FIG. 8 shows a plan view of an etching mask layer HM1 used to manufacture the above-described plurality of protrusions embedded in the semiconductor substrate, according to some embodiments of the present disclosure. FIG. 9 shows a plan view of one pattern 12 of the etching mask layer HM1 to etch the first protrusions P20 and dimensions of the one pattern 12 of the etching mask layer HM1 shown in FIG. 8. FIG. 10 shows a plan view of the patterns 12 of the etching mask layer HM1 in the region R1 shown in FIG. 8. For convenience of explanation, in FIG. 8, the patterns 12 of the etching mask layer HM1 in the region R1 are superimposed on the first to fourth protrusions P20, P30, P40, and P50.

According to some embodiments, the etching mask layer HM1 is made of a material having a relatively higher etching resistance, as compared to an etching resistance of the base layer 1, when an etching process such as a wet etching process is performed. In some embodiments, the etching mask layer HM1 is made of silicon oxide, silicon nitride, silicon oxynitride, a combination thereof, or any other suitable material. The etching mask layer HM1 can be formed by patterning a mask layer by a photolithography process followed by an etching process.

Referring to the drawings, the etching mask layer HM1 includes a plurality of patterns 12 arranged in an array, according to some embodiments. According to some embodiments, a pitch of the patterns 12 in X axis is the same as the first pitch b1 of the plurality of protrusions 10, and a pitch of the patterns 12 in Y axis is the same as the second pitch b3 of the plurality of protrusions 10.

According to some embodiments, tips (referring to those converged by {111} planes) of the plurality of protrusions 10 overlap respective patterns 12 of the etching mask layer HM1, in the X-Y coordinate system.

According to some embodiments, the pattern 12 has a square shape or a rectangular shape. In other embodiments, the pattern 12 has a circular shape, a polygonal shape, a diamond shape, or a triangular shape. The present disclosure, however, is not limited thereto.

In a case in which the pattern 12 has a square shape or a rectangular shape, sides of the pattern can be substantially parallel to or substantially perpendicular to the X axis or Y axis. The present disclosure, however, is not limited thereto. In other embodiments, the sides of the pattern 12 can be inclined with respect to the X axis or Y axis. For example, the sides of the pattern 12 can be inclined 135° or 45° with respect to the X axis or Y axis. In some embodiments, an inclined angle β of the sides of the pattern 12 with respect to the X axis or Y axis satisfies 45°−β1<β<45°+β2. α and β satisfy α+β=180°. Here, β1 and β2 are determined by the widths $X_1$ and $Y_1$ of the sides with respect to the widths of the bottom edges of the protrusion P20. For a non-limiting example, in a case in which the widths $X_1$ and $Y_1$ of the sides of the pattern 12 are equal to 10 nm and a width $Y_{11}$ of each bottom edge of the protrusion P20 is 300 nm, each of β1 and β2 is about 2°.

In a case in which the pattern 12 has a square shape or a rectangular shape, a ratio of the width $X_1$ of one side of the pattern 12 to the width $Y_1$ of another side of the pattern 12 is from 1:10 to 10:1. For example, the width $X_1$ is about 1 nm to about 10 nm and the width $Y_1$ of another side of the pattern 12 is about 1 nm to about 10 nm. The present disclosure, however, is not limited thereto.

According to some embodiments, in a case in which the base layer 1 is a (001) single crystal silicon and a germanium layer (i.e., a combined structure of the interlayer 2 and the upper layer 3, or the layer 2 in a case in which the upper layer 3 is omitted) is epitaxially grown on the plurality of protrusions 10 formed in the base layer 1 and has a thickness of about 200 nm to about 2 (from the bottom of the protrusion, i.e., from the plane Z1) in Z axis, a reduction of threading dislocation defect (TDD) is about $10^5$ cm$^{-2}$, as compared to an example in which a germanium layer having 1 μm is grown on a general silicon substrate having a planarized surface without any protrusions. For example, a ratio of TDD of a germanium layer grown on a general silicon substrate is about $10^7$ cm$^{-2}$ to TDD of a germanium layer having the same thickness grown on the protrusions 10 of the base layer 1 according to some embodiments is about $10^5$ or greater. That is, TDD of the germanium layer grown on the protrusions 10 of the base layer 1 according to some embodiments has a reduction of $10^5$, as compared to a general germanium layer.

In a case in which the first pitch b1 and the second pitch b3 of the patterns 12 (or the protrusions 10) are the same as each other and the pattern 12 has a square shape, a defect reduction ratio is equal to $X_1^2/4 \cdot 1/b1^2 \cdot c$, in which c is TDD factor, indicating a chance of defect existence. For example, if TDD=1, every site from (100) surface of an initial substrate generates a defect. When $X_1$ is about 1 nm to about 10 nm, b1 is about 50 nm to about 1000 nm, and c is equal to 1 according to design particulars, the defect reduction ratio can be designed to be about $10^{-2}$ to about $10^{-6}$, according to some embodiments.

As described above, the plurality of protrusions 10 are evenly distributed in X axis with the first pitch b1 and evenly distributed in Y axis with the second pitch b3. The present disclosure is not limited thereto. According to other embodiments, the plurality of protrusions 10 can be modified to include a first group of protrusions disposed in a first region of the semiconductor substrate and a second group of protrusions are disposed in a second region of the semiconductor substrate, and a pitch of the first group of protrusions in X axis is different from a pitch of the second group of protrusions in X axis and a pitch of the first group of protrusions in Y axis is different from a pitch of the second group of protrusions in Y axis.

FIGS. 11-15 show process steps of a method to manufacture the above-described semiconductor substrate, according to some embodiments. For convenience, FIGS. 11-15 illustrate cross-sectional views along line I-I' shown in FIG. 3.

Figure 11:
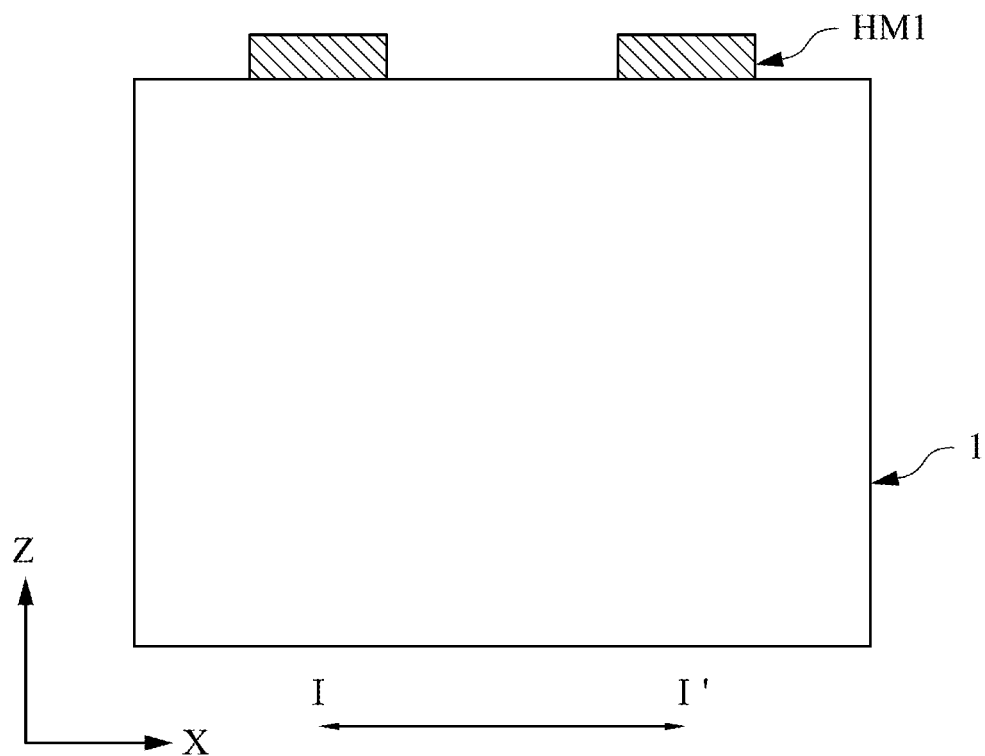
FIG. 11 shows a process step of a method to manufacture a semiconductor substrate, according to embodiments of the present disclosure.

Referring to FIG. 11, the etching mask layer HM1 is formed on a surface of the base layer 1. According to some embodiments, the base layer 1 includes, or consists essentially of, silicon, germanium, or silicon germanium. In some embodiments, the base layer is a (001) silicon wafer, and [110] or [101] crystallographic direction thereof is aligned to a diameter of the silicon wafer crossing the notch of the silicon wafer. According to some embodiments, the etching mask layer HM1 is made of a material having a relatively higher etching resistance, as compared to an etching resistance of the base layer 1, when an etching process such as a wet etching process is performed. In some embodiments, the etching mask layer HM1 is made of silicon oxide, silicon nitride, silicon oxynitride, a combination thereof, or any other suitable material. According to some embodiments, the etching mask layer HM1 is formed by patterning a mask layer by a photolithography process followed by an etching process to the mask layer.

Figure 12:
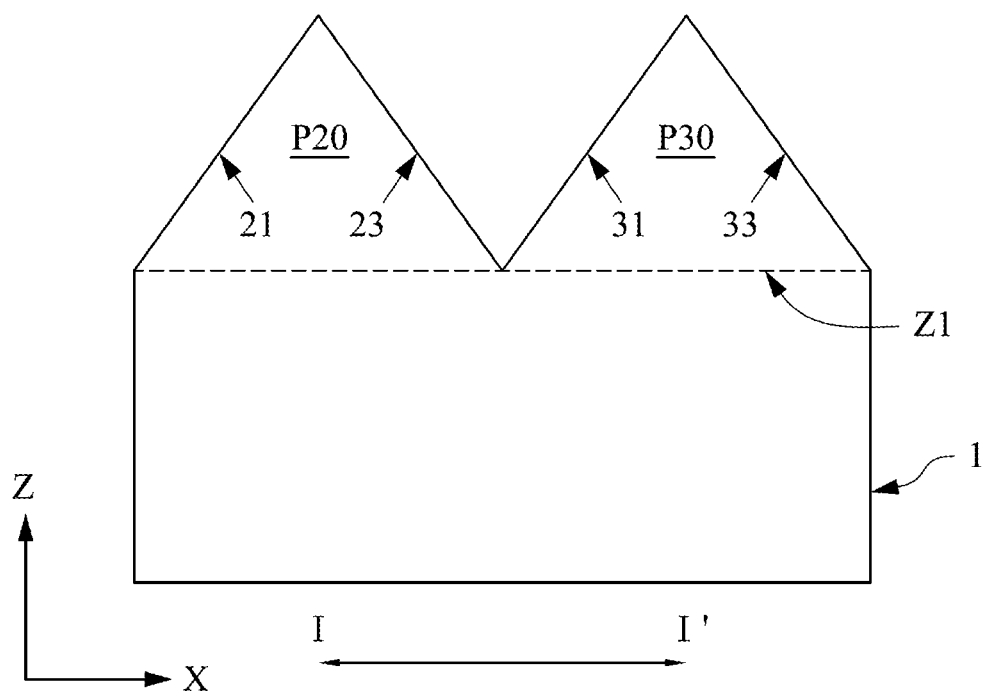
FIG. 12 shows a process step of a method to manufacture a semiconductor substrate, according to embodiments of the present disclosure.

Referring to FIG. 12, an etching process is performed by using the etching mask layer HM1 to etch portions of the base layer 1 exposed by the etching mask layer HM1. According to some embodiments, the etching process is a wet etching process using tetramethylammonium hydroxide (TMAH) or KOH, although the present disclosure is not limited thereto. Since the base layer 1 is made of a crystal material such as a single crystal material, etching rates along different crystallographic directions or etching rates to different crystallographic planes are different from each other. In this case, the wet etching process is an anisotropic etching process. In a case in which etching rates to (100), (110), and (111) crystallographic planes are m:n:o, m>n>o or m:n:o=1.0>0.5>0.05, and/or n>m>o or n:m:o=1.0>0.5>0.05 are satisfied. In some embodiments, due to different etching rates along different crystallographic directions, an undercut phenomenon occurs during etching. Thus, if the etching process is sufficiently performed, the etching stops when the chemical used to etch the base layer 1 meets {111} planes of the base layer 1. In this case, the plurality of protrusions, represented by the first and second protrusions P20 and P30 in FIG. 12, are formed. Accordingly, the structure shown in FIG. 12 does not have (001) planes exposed in regions between adjacent protrusions. According to some embodiments, {111} planes of the same protrusion converge at the tips thereof, and accordingly, portions or the entirety of the etching mask layer HM1 peels off from the base layer 1 during the etching process or at the end of the etching process.

Although not shown, an etching mask removal process can be performed to secure complete removal of the etching mask layer HM1 on the base layer, after the above-described wet etching process.

Figure 13:
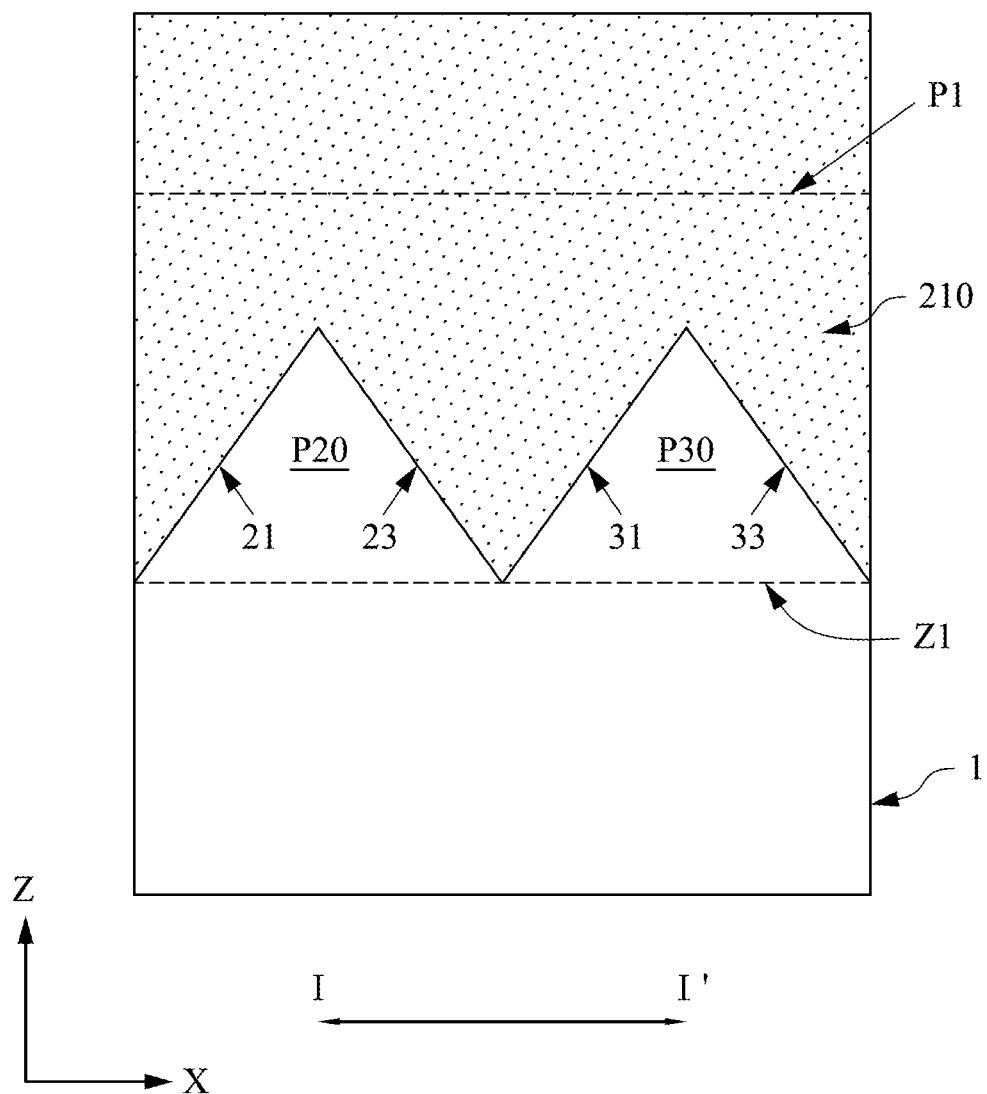
FIG. 13 shows a process step of a method to manufacture a semiconductor substrate, according to embodiments of the present disclosure.

Thereafter, referring to FIG. 13, an interim layer 210 is grown on the protrusions of the base layer 1 in any suitable epitaxial deposition system, including, but not limited to, atmospheric-pressure CVD (APCVD), low pressure CVD (LPCVD), ultra-high-vacuum CVD (UHVCVD), by molecular beam epitaxy (MBE), or by atomic layer deposition (ALD). In the CVD process, epitaxial growth typically includes introducing a source gas into the chamber. The source gas can include at least one precursor gas and a carrier gas, such as hydrogen. The reactor chamber is heated, such as, by RF-heating. The growth temperature in the chamber ranges from about 350° C. to about 550° C. and the pressure in the chamber ranges from about 100 Torr to about 500 Torr, depending on the composition of the interim layer 210. The epitaxial growth system can also utilize low-energy plasma to enhance the layer growth kinetics. The epitaxial growth system can be a single-wafer or multiple-wafer batch reactor.

According to some embodiments, the interim epitaxial layer 210 is grown directly on the {111} planes of base layer 1. According to some embodiments, the interim layer 210 is sufficiently grown such that the interim layer 210 not only covers the {111} planes but also covers the tips of the protrusions.

According to some embodiments, an annealing process is performed to the interim layer 210 to annihilate damage and defects and/or crystalize the interim layer 210. The annealing is performed, for example, from a temperature from 600° C. to about 900° C. in a vacuum chamber having a pressure from about 1 Torr to about 10 Torr for about 100 seconds to about 600 seconds.

Figure 14:
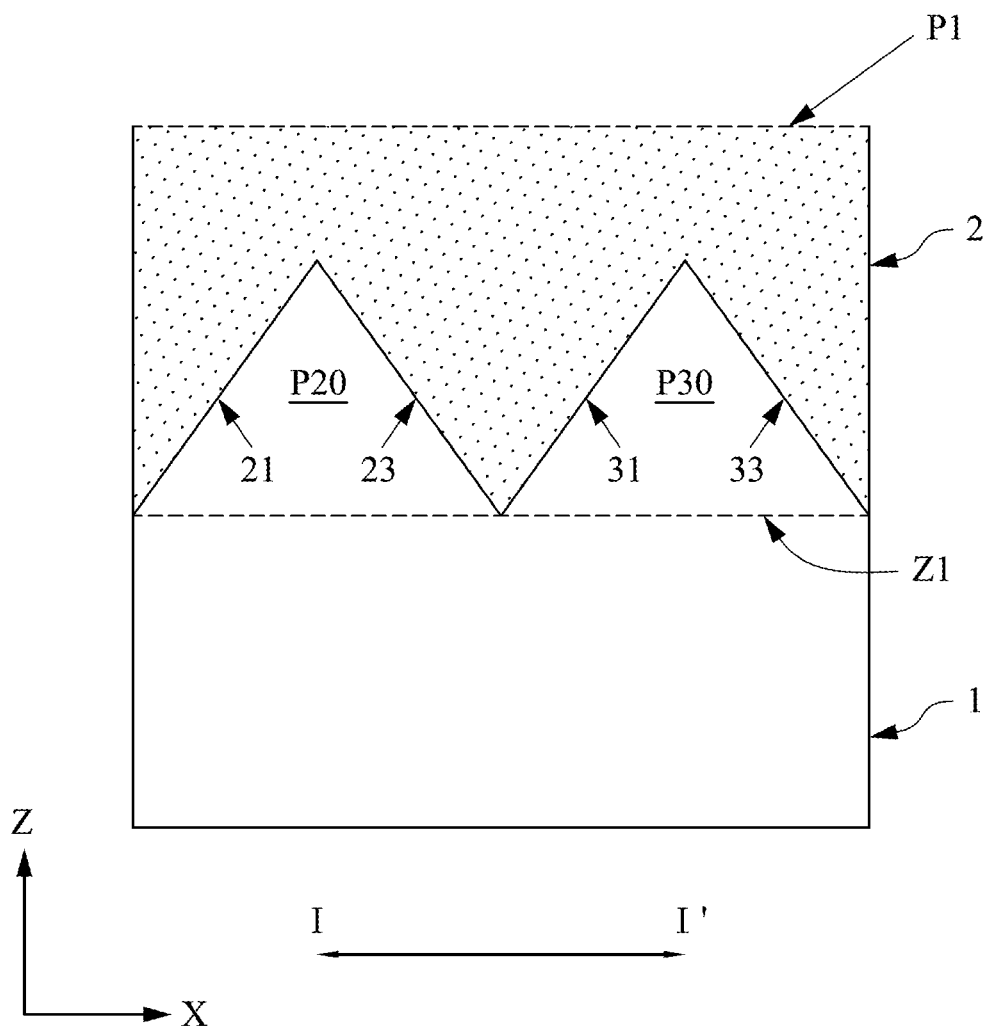
FIG. 14 shows a process step of a method to manufacture a semiconductor substrate, according to embodiments of the present disclosure.

Now referring to FIG. 14, a planarization process such as a CMP is performed to the interim layer 210 to obtain a planarized surface suitable to regrow additional layer(s) such as the upper layer 3 in one of the above-described epitaxial deposition systems. In this case, the interim layer 210 is reduced to a level of an intermediate plane P1 by the planarization process. In some embodiments, the interim layer 210 is converted to the interlayer 2 by the planarization process without exposing the protrusions of the base layer 1.

Figure 15:
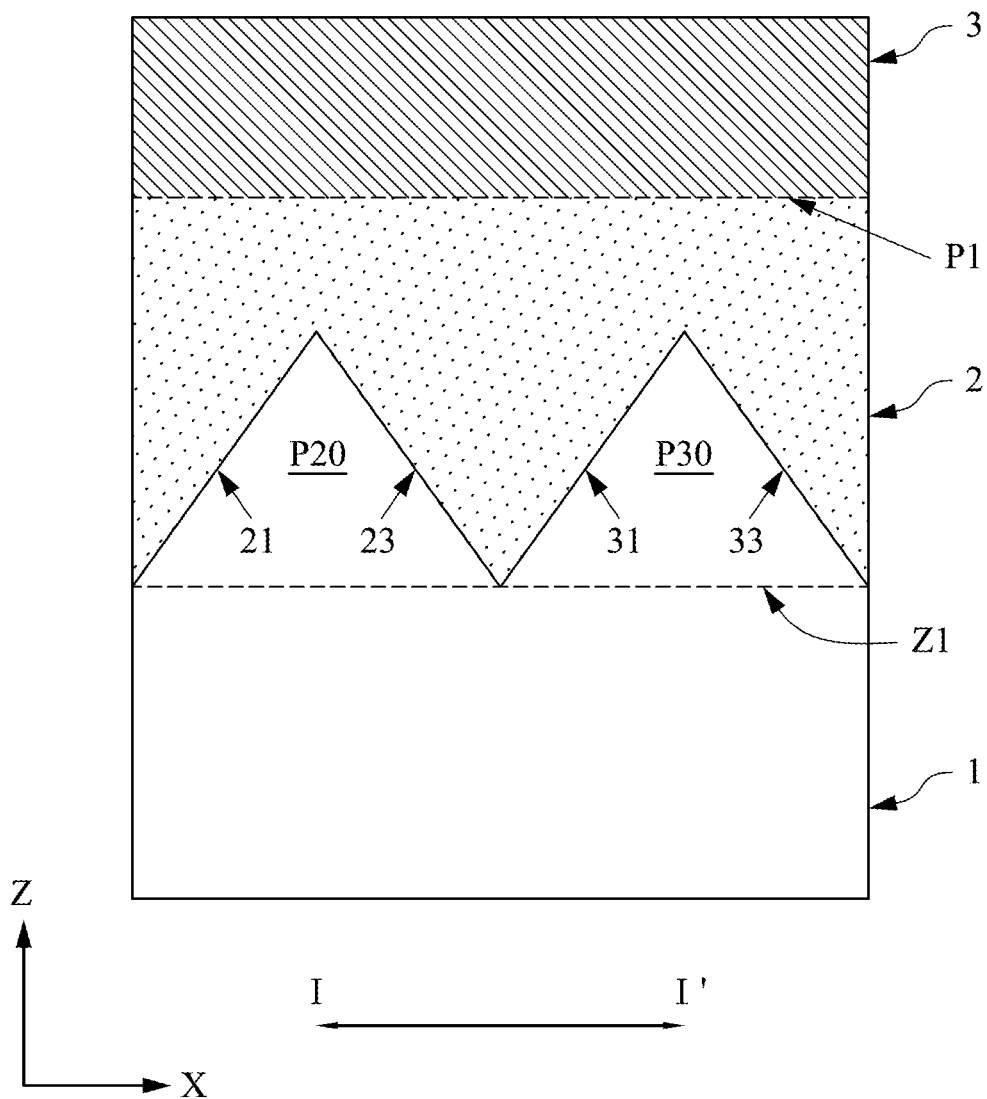
FIG. 15 shows a process step of a method to manufacture a semiconductor substrate, according to embodiments of the present disclosure.

Next, as shown in FIG. 15, the upper layer 3 is grown on the interlayer 2 in one of the above-described epitaxial deposition systems. According to some embodiments, the recipe to grow the upper layer 3 is the same as that used to grow the interim layer 210, although duration to form the upper layer 3 can be different from that to form the interim layer 210.

Although not shown, another planarization process such as a CMP can be optionally performed to the upper layer 3, according to design particulars.

In other embodiments, the process step shown in FIG. 15 can be omitted. In this case, the upper portion of the remaining portion 210 (i.e., the upper portion of the layer 2) after planarization process can be used to manufacture semiconductor devices or integrated circuits.

Figure 16:
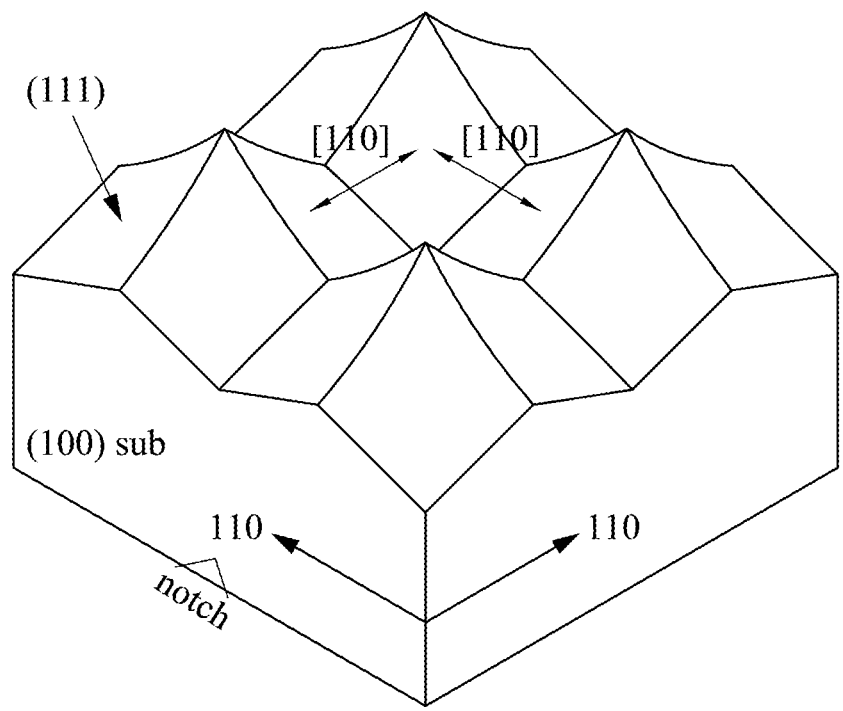
FIG. 16 shows a three-dimensional view of protrusions in a base layer for forming a semiconductor substrate, according to embodiments of the present disclosure.

FIG. 16 shows a three-dimensional view of protrusions in a base layer for forming a semiconductor substrate, according to embodiments of the present disclosure.

According to some embodiments, in a case in which the first pitch b1 and the second pitch b3 shown in FIG. 3 increase, the protrusions formed in the base layer have a structure shown in FIG. 16. Accordingly, each facet of the protrusions, corresponding to a {111} plane, becomes a rhombus shape rather than a triangular shape, in a case in which the above described wet etching is sufficiently performed.

In some embodiments, adjacent facets of two adjacent protrusions are in contact with each other, such that no {100} plane of the base layer 1 is exposed from the protrusions or between the protrusions. In some embodiments, only {111} planes of the base layer (not including a peripheral region of the base layer 1 that surrounds a central region of the base layer in which the protrusions are formed) are in contact with the interlayer.

Figure 17:
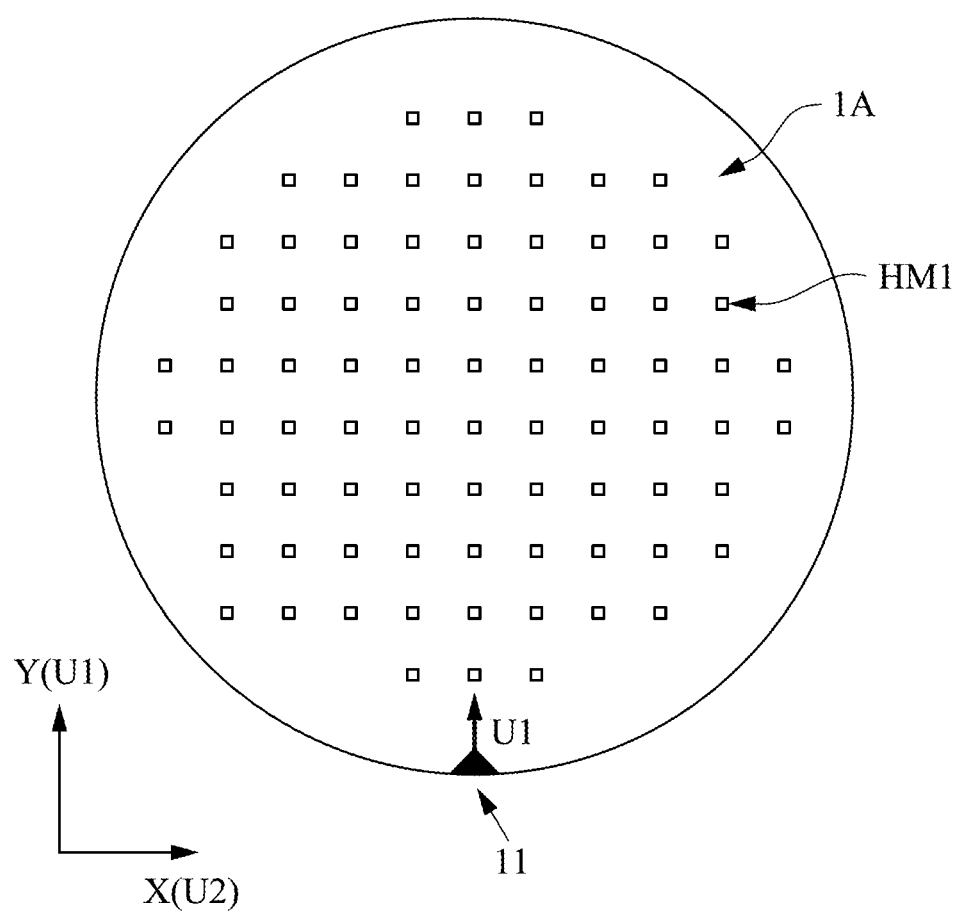
FIG. 17 shows a plan view of an etching mask layer, overlaying a base layer, used to manufacture a plurality of protrusions embedded in a semiconductor substrate, according to embodiments of the present disclosure.

FIG. 17 shows a plan view of an etching mask layer HM1, overlaying a base layer, used to manufacture a plurality of protrusions embedded in a semiconductor substrate, according to some embodiments of the present disclosure.

According to some embodiments, the etching mask layer HM1 and individual pattern 12 thereof shown in FIG. 17 are the same as those described above. A base layer 1A shown in FIG. 17 is substantially the same as the base layer 1 except that a crystallographic direction of the base layer 1A with respect to the etching mask layer HM1 is configured differently. To avoid redundancy, an overlapped description thus will be omitted.

Referring to FIG. 17, sides of the pattern 12 are parallel to X axis or Y axis. The base layer 1A has a wafer shape including a notch 11, and has {110} plane parallel to or substantially parallel to a plane defined by an X-Y coordinate system (in which X axis and Y axis are perpendicular to each other), according to some embodiments.

In a plan view defined by the X-Y coordinate system, a crystallographic direction U1 of the base layer 1A, i.e., a direction from the notch 11 to a center of the base layer 1A or a direction along a diameter direction passing through the notch 11, is crystallographic direction <110> or substantially parallel to crystallographic direction <110>, and a crystallographic direction U2 of the base layer 1A passing through the notch 11 and perpendicular to the crystallographic direction U1 is a crystallographic direction <100> or substantially parallel to another crystallographic direction <100>, according to some embodiments.

According to other embodiments, in a plan view defined by the X-Y coordinate system, the crystallographic direction U1 of the base layer 1A, i.e., the direction from the notch 11 to the center of the base layer 1A or a direction along a diameter direction passing through the notch 11, is crystallographic direction <100> or substantially parallel to crystallographic direction <100>, and the crystallographic direction U2 of the base layer 1A passing through the notch 11 and perpendicular to the crystallographic direction U1 is a crystallographic direction <110> or substantially parallel to another crystallographic direction <110>.

According to some embodiments, an etching process is performed by using the etching mask layer HM1 to etch portions of the base layer 1A exposed by the etching mask layer HM1. According to some embodiments, the etching process is a wet etching process using TMAH or KOH, although the present disclosure is not limited thereto. Since the base layer 1A is made of a crystal material such as a single crystal material, etching rates along different crystallographic directions or etching rates to different crystallographic planes are different from each other. In a case in which etching rates to (100), (110), and (111) crystallographic planes are m:n:o, m>n>o or m:n:o=1.0>0.5>0.05, and/or n>m>o or n:m:o=1.0>0.5>0.05 are satisfied. Protrusions, similar to the protrusions 10, can be formed in the base layer 1A, based on the aforementioned manufacturing processes with reference to FIGS. 11 and 12, according to some embodiments.

An interlayer 2A and an upper layer 3A, made of a material different from that of the base layer 1A, can be grown on facets of the protrusions of the base layer 1A, based on the aforementioned manufactured processes to grown the interlayer 2 and the upper layer 3 with reference to FIGS. 13-15. Accordingly, a semiconductor substrate, having a structure similar to the above-described semiconductor substrate except that the crystallographic direction of the base layer 1A is different from the base layer 1, can be formed. In some embodiments, the upper layer 3A can be omitted. In this case, the semiconductor substrate includes the base layer 1A and the layer 2A made of a material having a lattice constant different from that of the base layer 1B. Accordingly, the layer 2A is an exterior layer of the semiconductor substrate, and semiconductor devices or integrated circuits can be manufactured in or on the upper portion of the layer 2A.

Figure 18:
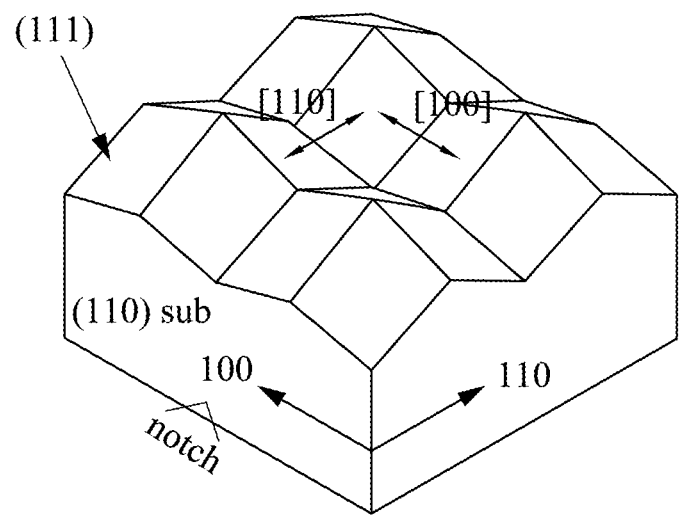
FIG. 18 shows a three-dimensional view of protrusions in a base layer for forming a semiconductor substrate, according to embodiments of the present disclosure.

FIG. 18 shows a three-dimensional view of protrusions in a base layer for forming a semiconductor substrate, according to embodiments of the present disclosure, in which the base layer is a (110) wafer, and a line passing through a notch and a center of the wafer shaped base layer is along [110] crystallographic direction, and a line perpendicular to the [110] crystallographic direction and passing through the notch is [100] crystallographic direction.

Figure 19:
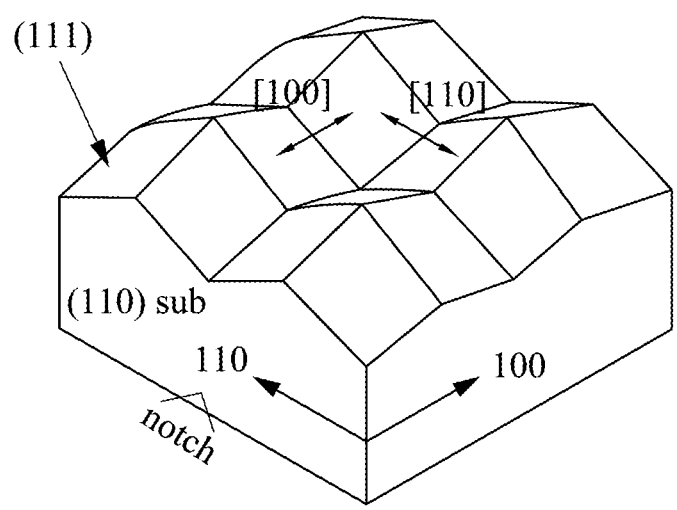
FIG. 19 shows a three-dimensional view of protrusions in a base layer for forming a semiconductor substrate, according to embodiments of the present disclosure.

FIG. 19 shows a three-dimensional view of protrusions in a base layer for forming a semiconductor substrate, according to embodiments of the present disclosure, in which the base layer is a (110) wafer, and a line passing through a notch and a center of the wafer shaped base layer is along [100] crystallographic direction, and a line perpendicular to the [100] crystallographic direction and passing through the notch is [110] crystallographic direction.

FIGS. 18 and 19 show that even the base layers with different crystallographic directions are used, the same structure such as protrusions having pyramid shapes with rhombus-shaped surfaces corresponding to {111} planes can be obtained. In some embodiments, adjacent facets of two adjacent protrusions are in contact with each other, such that no {110} plane of the base layer 1A is exposed from the protrusions or between the protrusions. In some embodiments, only {111} planes of the base layer 1A (not including a peripheral region of the base layer 1A that surrounds a central region of the base layer 1A in which the protrusions are formed) are in contact with the interlayer. Thus, according to some aspects, the principle of the present disclosure to make a semiconductor substrate can extend to base layers such as silicon wafers having different crystallographic directions.

Other overlapped description of the semiconductor substrate and the manufacturing method thereof can be referred to the above descriptions with reference to FIGS. 2-19 and thus will be omitted to avoid redundancy.

Figure 20:
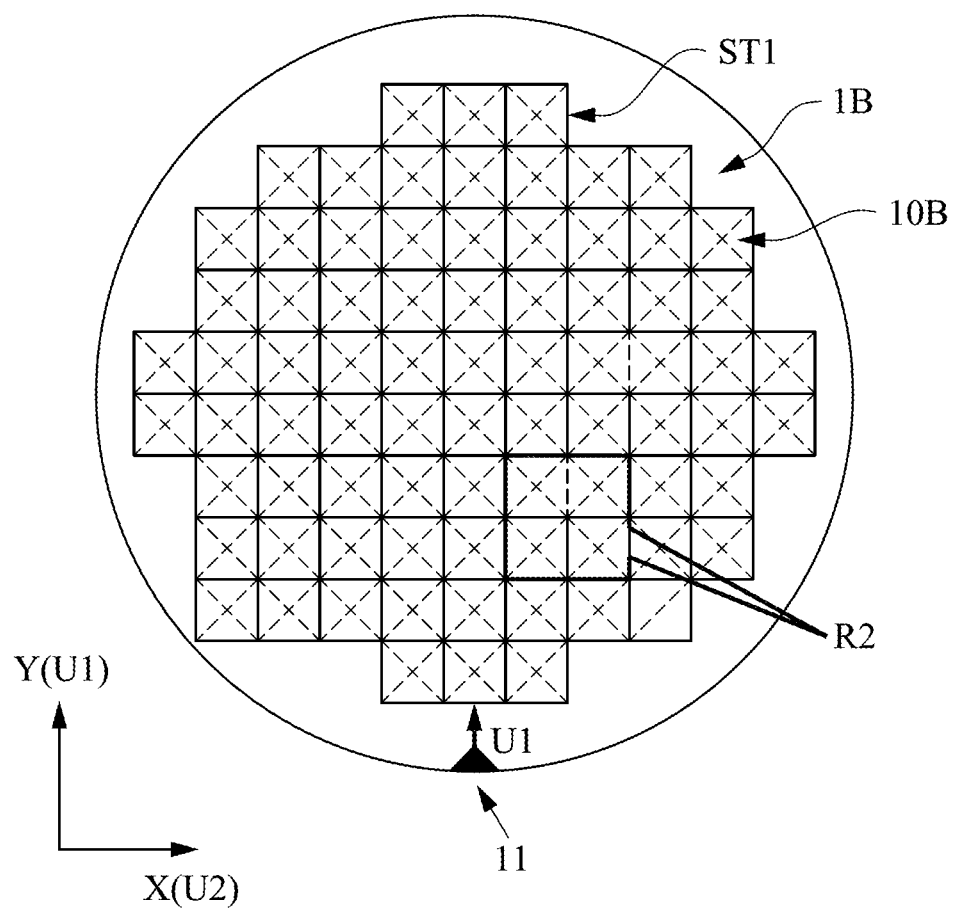
FIG. 20 shows a plan view of a semiconductor substrate according to embodiments of the present disclosure.

FIG. 20 is a plan view of a semiconductor substrate according to embodiments of the present disclosure.

Referring to the drawings, a semiconductor substrate according to embodiments of the present disclosure includes a base layer 1B, an interlayer 2B disposed on the base layer 1B, and an upper layer 3B disposed on the interlayer 2B.

The semiconductor substrate can act as a substrate, based on which semiconductor devices or integrated circuits can be manufactured by a series of semiconductor manufacturing processes including, but not limited to, oxidation, lithography, etching, deposition of thin films such as metal or dielectric films, and planarization such as chemical-mechanical polishing (CMP).

Referring to the drawings, in some embodiments, the base layer 1B is a crystal material having crystal lattice the same as or similar to those shown in FIGS. 1A-1C. In some embodiments, the base layer 1B is crystal semiconductor such as single crystal silicon. In some embodiments, the base layer 1B is a device layer of a silicon-on-insulator (SOI) wafer, although an oxide layer and a handle layer of the SOI wafer are not shown in the drawings. In some embodiments, the device layer of the SOI wafer is made of crystal semiconductor such as single crystal silicon. In some embodiments, the base layer 1 is crystal semiconductor such as single crystal silicon disposed on one or more layers (not shown) which can be made of an amorphous or polycrystalline material or made of another signal crystal material (not shown) different from the material forming the base layer 1B. In some embodiments, the base layer 1B is made of germanium or silicon germanium. The present disclosure, however, is not limited thereto.

Referring to FIG. 20, the base layer 1B has a wafer shape including a notch 11, according to some embodiments. In a plan view defined by an X-Y coordinate system (in which X axis and Y axis are perpendicular to each other), a crystallographic direction U1 of the base layer 1B, i.e., a direction from the notch 11 to a center of the base layer 1B or a direction along a diameter direction passing through the notch 11, is <110> or substantially parallel to crystallographic direction <110>, and a crystallographic direction U2 of the base layer 1B passing through the notch 11 and perpendicular to the crystallographic direction U1 is another crystallographic direction <110> or substantially parallel to another crystallographic direction <110>, according to some embodiments. In some embodiments, the base layer 1 having {100} plane parallel to or substantially parallel to a plane defined by the X-Y coordinate system. According to some embodiments, X axis and the crystallographic direction U1 are parallel to each other.

Still referring to FIG. 20, the base layer 1B includes a plurality of cavities 10B arranged in an array and separated from each other by an insulating layer such as shallow trench isolation (STI) embedded in the base layer 1B, according to some embodiments. Edges (or boundaries) of the plurality of cavities 10B or the STI are substantially parallel to X axis or Y axis, according to embodiments.

Figure 21:
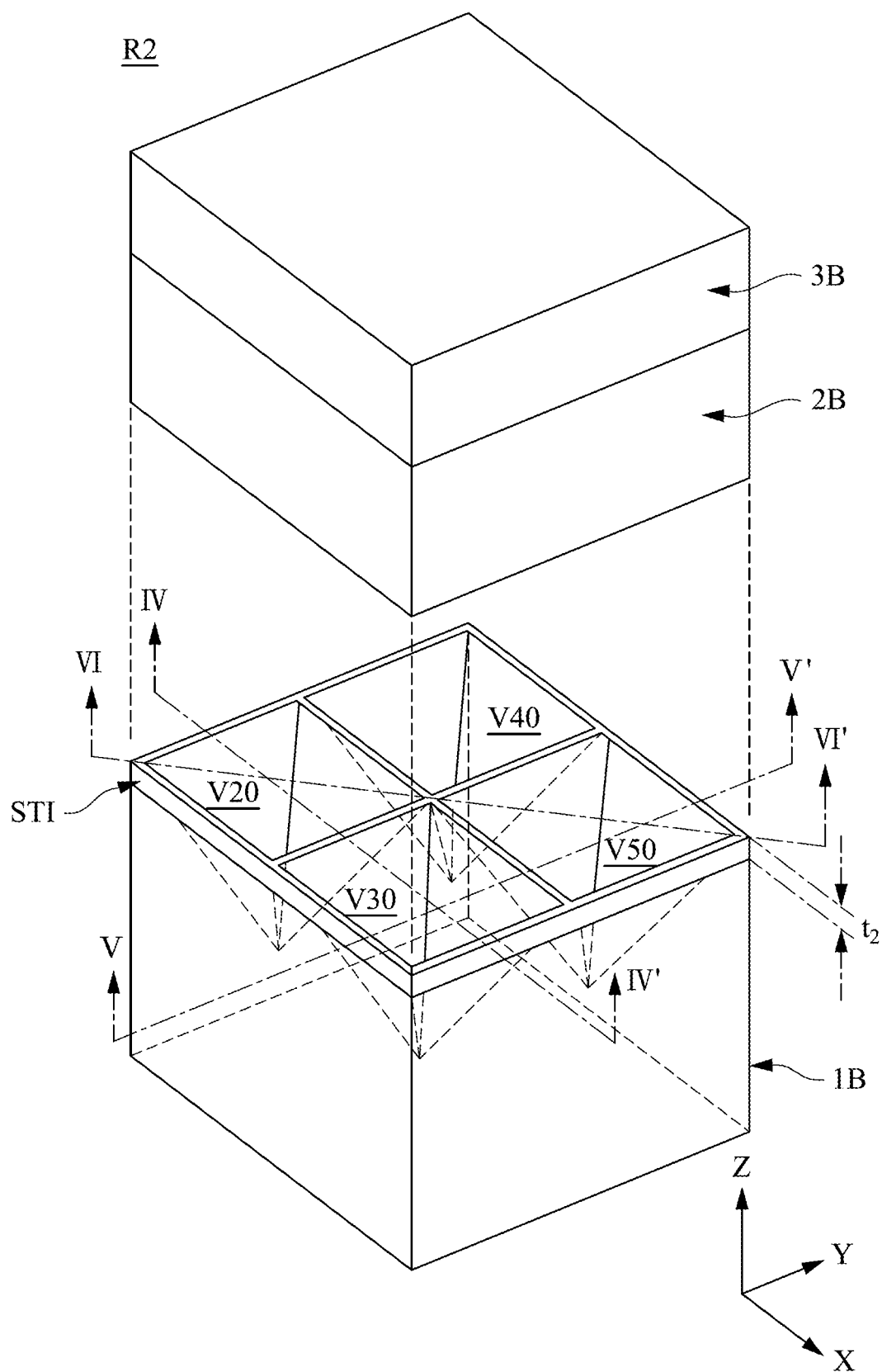
FIG. 21 shows an exploded three-dimensional view of cavities located in a region R2 of the semiconductor substrate shown in FIG. 20.
Figure 22:
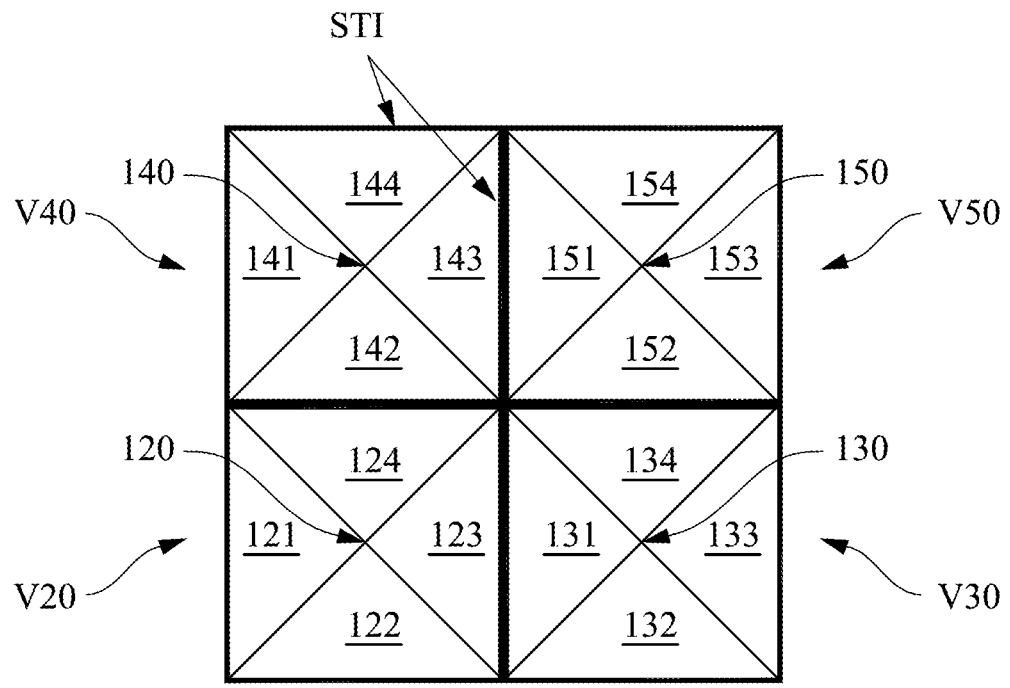
FIG. 22 shows a plan view of a base layer in the region R2 of the semiconductor substrate.
Figure 22:
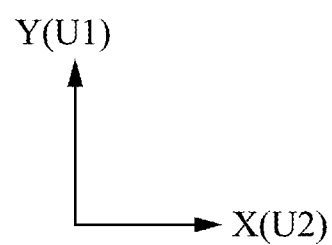
Figure 23:
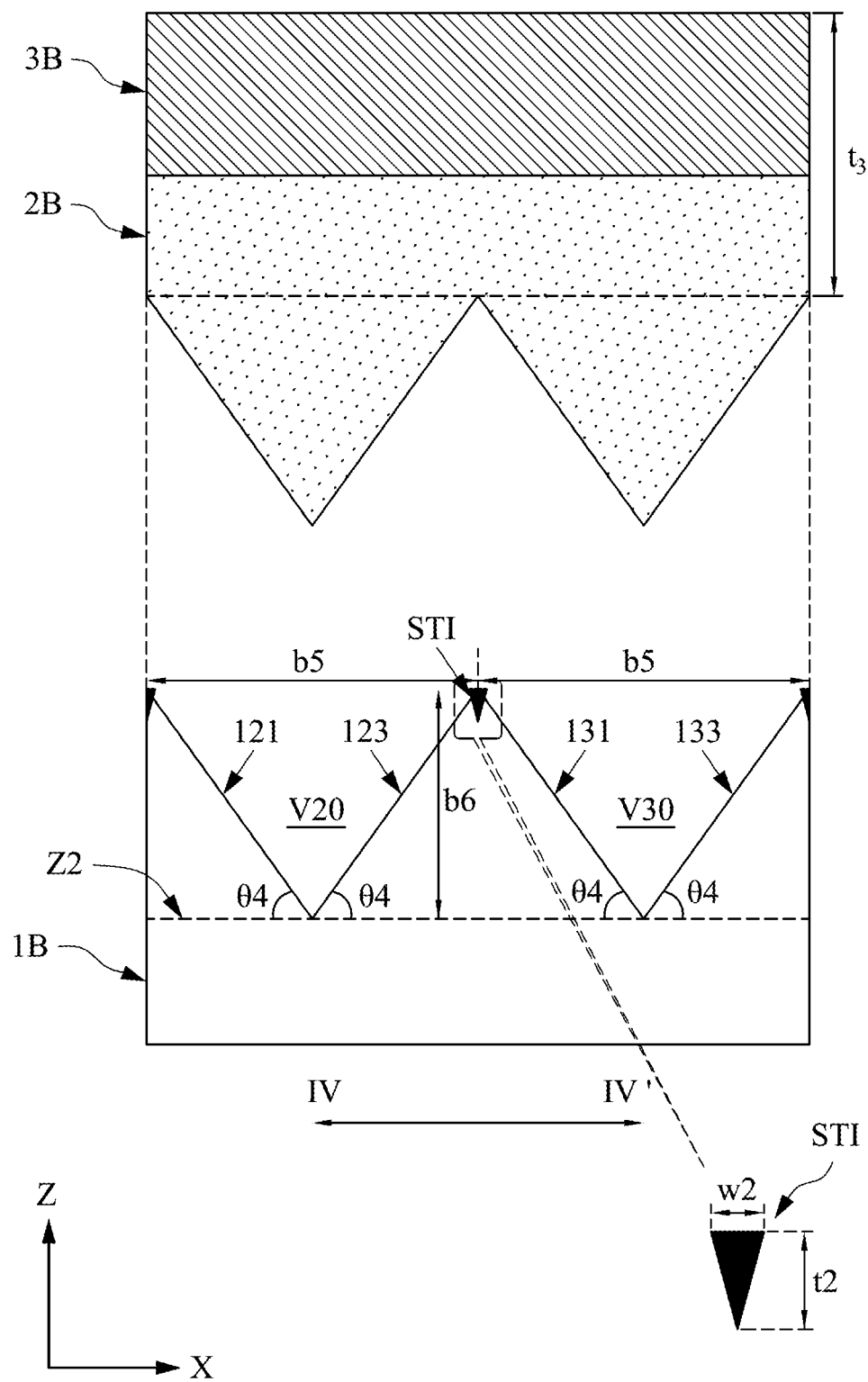
FIG. 23 shows a cross-sectional view of the region R2 of the semiconductor substrate taken along line IV-IV' shown in FIG. 21.
Figure 24:
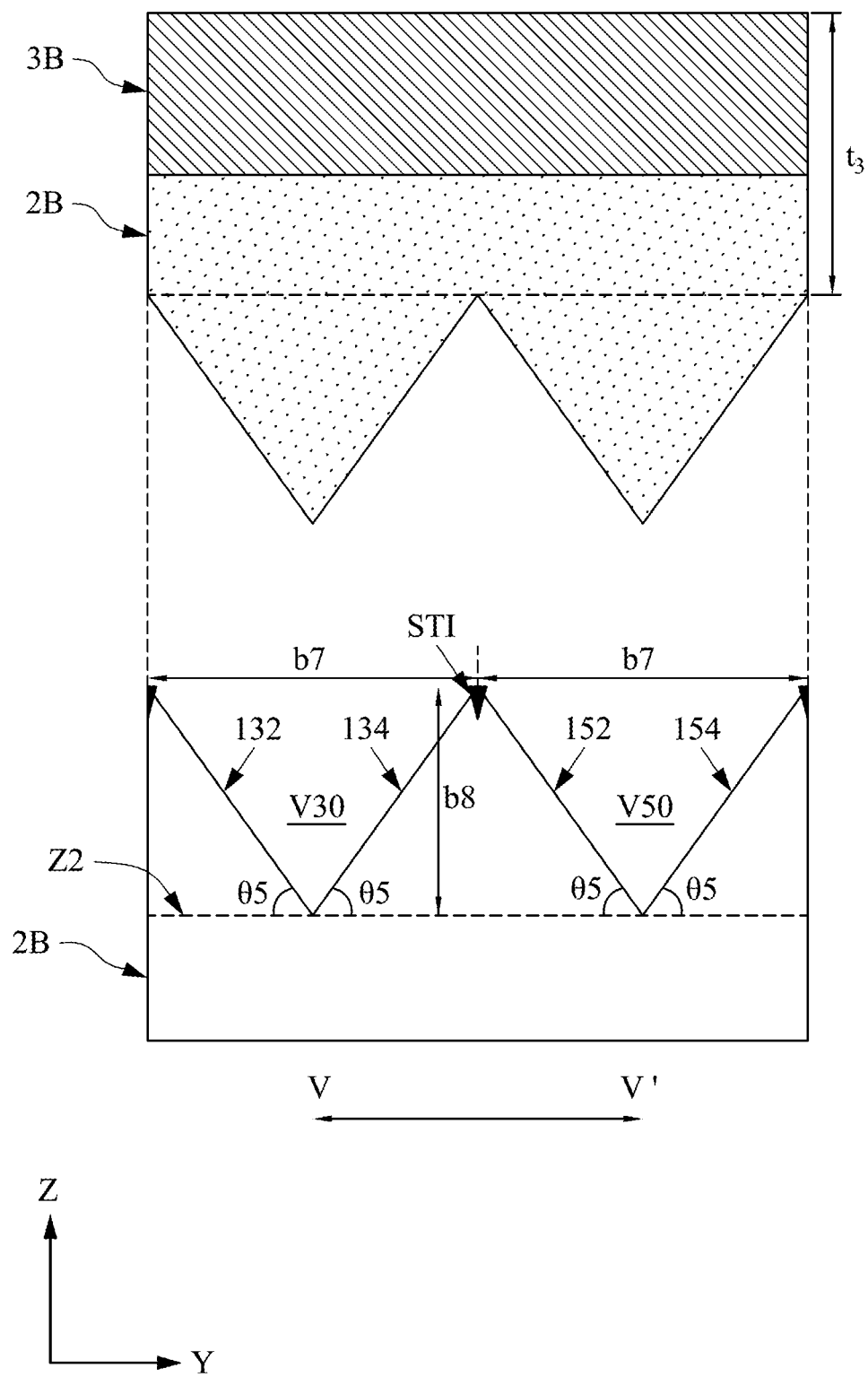
FIG. 24 shows a cross-sectional view of the region R2 of the semiconductor substrate taken along line V-V' shown in FIG. 21.
Figure 25:
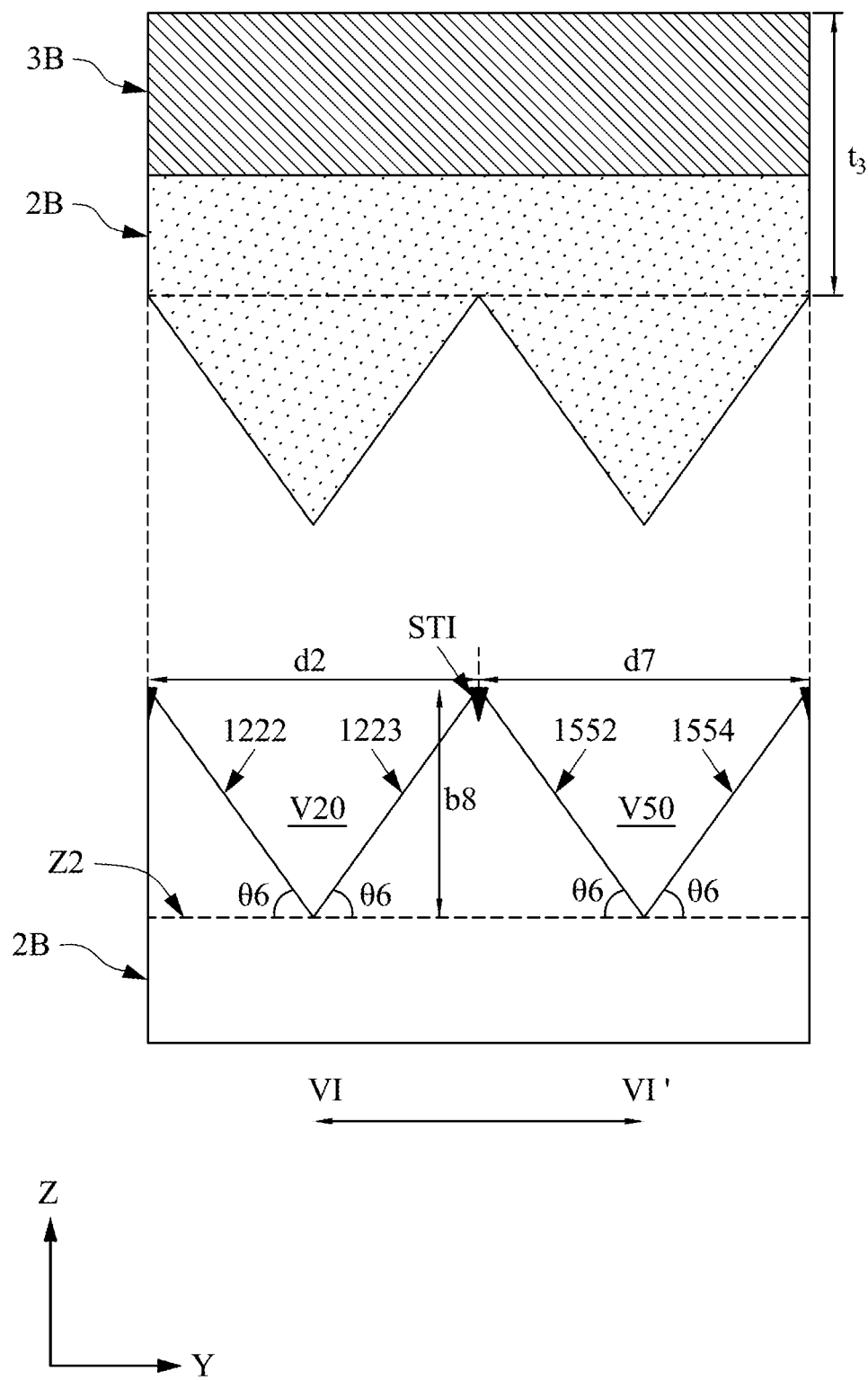
FIG. 25 shows a cross-sectional view of the region R2 of the semiconductor substrate taken along line VI-VI' shown in FIG. 21.

FIG. 21 shows an exploded three-dimensional view of cavities including first to fourth cavities V20, V30, V40, and V50 of the plurality of cavities 10B, located in a region R2 of the semiconductor substrate shown in FIG. 20. FIG. 22 is a plan view of the base layer 1A in the region R2 of the semiconductor substrate. FIG. 23 is a cross-sectional view of the region R2 of the semiconductor substrate taken along line IV-IV' shown in FIG. 21. FIG. 24 is a cross-sectional view of the region R2 of the semiconductor substrate taken along line V-V' shown in FIG. 21. FIG. 25 is a cross-sectional view of the region R2 of the semiconductor substrate taken along line VI-VI' shown in FIG. 21.

Referring to the drawings, the first cavity V20 and the second cavity V30 are arranged in X axis, the third cavity V40 and the fourth cavity V50 are arranged in X axis, the first cavity V20 and the third cavity V40 are arranged in Y axis, and the second cavity V30 and the fourth cavity V50 are arranged in Y axis. Z axis is an axis perpendicular to X axis and Y axis. In some embodiments, Z axis is along a crystallographic direction <100> or substantially parallel to a crystallographic direction <100>.

The first cavity V20 has four facets 121 through 124 which converge at a first bottom 120, the second cavity V30 has four facets 131 through 134 which converge at a second bottom 130, the third cavity V40 has four facets 141 through 144 which converge at a third bottom 140, and the fourth cavity V50 has four facets 151 through 154 which converge at a fourth bottom 150. In some embodiments, each of the facets of the first to fourth cavities V20, V30, V40, and V50 is a {111} crystallographic plane. In some embodiments, each cavity 10B has a reverse-pyramid shape and each of the facets thereof has a triangular shape. The present disclosure, however, is not limited thereto. In some embodiments, adjacent cavities 10B are separated from each other by the STI having a thickness $t_2$ of about 5 nm to about 30 nm. The thickness $t_2$ of the STI is not limited thereto and can be adjusted according to design particulars.

In some embodiments, the bottoms of the first to fourth cavities V20, V30, V40, and V50 coincide a plane Z2 parallel to a {100} plane of the base layer 1B. The present disclosure, however, is not limited thereto.

In some embodiments, only {111} planes of the base layer 1B inside each cavity 10B are in contact with the interlayer 2B.

Referring to FIG. 23, a first pitch b5 of the first and second cavities V20 and V30 in X axis is defined to be a distance between centers of the adjacent STI in X axis or centers of the first and second cavities V20 and V30, and a depth (or height) b6 of the first and second cavities V20 and V30 is defined to be a distance between the first bottom 120 (or the second bottom 130) to the upmost portion of the base layer 1B in Z axis. In some embodiments, $$b6 = \frac{\sqrt{2}}{2} b5$$

is satisfied, and in this case, a first angle θ4 between the facet 123 (or 131) and the plane Z2 is about 54.7°. The present disclosure should not be limited thereto. In other embodiments, the first angle θ4 is about 45° to about 59°, due to process variations during manufacturing. A cross-sectional view of the STI has a triangular shape having a top side having a width of w2 and a height or depth of t2. In some embodiments, a ratio of w2 to t2 is in a range of about 2 to about 5. Since the STI is designed to have a triangular shape having the depth t2 greater than the width w2 of the top side, an area required to form STI is relatively small as compared to an example in which the STI has a rectangular cross-sectional shape having width and length thereof equal to the width w2 and the depth t2, respectively. Accordingly, in a unit area, a relatively large region is available as an active region during manufacturing semiconductor devices by using the semiconductor substrate.

In some embodiments, the first pitch b5 is about 50 nm to about 1000 nm. The present disclosure is not limited thereto.

Referring to FIG. 24, a second pitch b7 of the second and fourth cavities V30 and V50 in Y axis is defined to be a distance between the second bottom 130 and the fourth bottom 140 in Y axis and a depth (or height) d8 of the second and fourth cavities V30 and V50 is defined to be a distance between the second bottom 130 (or the fourth bottom 150) to the base thereof in Z axis. In some embodiments, $$b8 = \frac{\sqrt{2}}{2} b7$$

is satisfied, and in this case, a second angle θ5 between the facet 134 (or 152) and the plane Z2 is about 54.7°. The present disclosure should not be limited thereto. In other embodiments, the second angle θ5 is about 45° to about 59°, due to process variations during manufacturing. In some embodiments, the first angle θ4 and the second angle θ5 are the same or substantially the same as each other. In other embodiments, the first angle θ4 and the second angle θ5 can be substantially different from each other.

In some embodiments, the second pitch b7 is about 50 nm to about 1000 nm. The present disclosure is not limited thereto. In some embodiments, the first pitch b5 and the second pitch b7 are equal to each other. In other embodiments, the first pitch b5 and the second pitch b7 are different from each other.

Referring to FIG. 25, a diagonal pitch d2 of the first and fourth cavities V20 and V50 in a diagonal direction is √2·b5, in a case in which the first pitch b5 is equal to the second pitch b7. Thus, a third angle θ6 between a common edge 1223 or 1222 of two facets of the first cavity V20 (or a common edge 1552 or 1554 of two facets of the fourth cavity V40) and the plane Z2 is about 45°. The present disclosure should not be limited thereto. In other embodiments, the third angle θ6 is about 35° to about 55°, due to process variations during manufacturing.

Referring to FIGS. 20, 21, and 23-25, the semiconductor substrate further includes the interlayer 2B disposed on the base layer 1B, filling spaces of the cavities 10 of the base layer 1A, and covering the bottoms of the plurality of cavities 10B of the base layer 1A, and the upper layer 3B disposed on the interlayer 2B, as briefed above.

According to some embodiments, the interlayer 2B is made of a material different from that used to form the base layer 1B and is directly formed on the base layer 1B. The interlayer 2B has a structure complementary to the plurality of cavities 10B, such that the interlayer 2B and the base layer 1B form a hetero-structure having a hetero-junction at the interfaces therebetween.

According to some embodiments, the upper layer 3B is directly formed on the interlayer 2B. In some embodiments, the interlayer 2B and the upper layer 3B are made of the same material. In some embodiments, the semiconductor substrate further includes additional one or more layers (not shown) between the interlayer 2B and the upper layer 3B. The additional one or more layers, if included, each have planarized surfaces contacting adjacent layers.

According to some embodiments, the material for forming the base layer 1B can include, or consist essentially of, a group II, a group III, a group IV, a group V, and/or a group VI element, and/or compounds thereof, for example, selected from the group consisting of silicon, germanium, silicon germanium, gallium arsenide, aluminum antimonide, indium aluminum antimonide, indium antimonide, indium arsenide, indium phosphide, and gallium nitride. According to some embodiments, the material for forming the interlayer 2B and thereabove of the semiconductor substrate is different from that used to form the base layer 1B and can include, or consist essentially of, a group II, a group III, a group IV, a group V, and/or a group VI element, and/or compounds thereof, for example, selected from the group consisting of silicon, germanium, silicon germanium, gallium arsenide, aluminum antimonide, indium aluminum antimonide, indium antimonide, indium arsenide, indium phosphide, and gallium nitride.

According to some embodiments, in a case in which the base layer 1B includes, or consists essentially of, silicon, the interlayer 2B and the upper 3B include, or consist essentially of, germanium. The present disclosure, however, is not limited thereto.

In some embodiments, impurities are doped in the interlayer 2B and the other layer(s) thereabove of the semiconductor substrate, such that the upper portion of the semiconductor substrate is N-type or P-type suitable to manufacture semiconductor devices or integrated circuits.

In other embodiments, the interlayer 2B and the other layer(s) thereabove of the semiconductor substrate are intrinsic. In this case, the upper portion of the semiconductor substrate can be doped impurities to covert the upper portion of the semiconductor substrate to N-type or P-type during manufacturing semiconductor devices or integrated circuits.

According to some embodiments, the layers of the semiconductor substrate including the interlayer 2B and thereabove are made of the same material, but by different processes. In some embodiments, different processes include the same processing condition (i.e., the same recipe) but separated performed, so as to allow another process including, but not limited to, planarization such as CMP, to be performed between the different processes. In other embodiments, different processes mean different growing recipes, regardless of whether different recipes are sequentially performed with or without another process therebetween. In some embodiments, the epitaxial layers of the semiconductor substrate including the interlayer 2B and thereabove are integrated with each other, such that a boundary therebetween is not apparent, even if examined by, for example, an SEM or a TEM. In other embodiments, some of the layers of the semiconductor substrate including the interlayer 2B and thereabove are integrated with each other but with an interface therebetween which is distinguishable if examined by, for example, an SEM or a TEM. A thickness $t_3$ of the material for forming the interlayer 2 and thereabove, determined from the upmost portion of the base layer 1B to an exterior surface of the semiconductor substrate, is about 100 nm to about 2000 nm according to some embodiments, although the present disclosure is not limited thereto.

As described above, the base layer 1B includes a plurality of cavities 10B having facets which are (111) crystallographic planes, and a material grown on the base layer 1B, i.e., directly on the (111) crystallographic planes of the base layer 1B, to form the interlayer 2B and thereabove is different from the material for forming the base layer 1B. Thus, lattice mismatch exists at the interfaces of the base layer 1B and the interlayer 2B.

Since the interfaces between the base layer 1B and the interlayer 2B are substantially {111} crystallographic planes, dislocations, if existing in the interlayer 2, due to the lattice mismatch arise from {111} crystallographic planes, mainly propagate along <110> directions and between the {111} crystallographic planes of each cavity 10B, according to some embodiments. The dislocation propagation pattern, i.e., Taylor pattern, helps releasing the strain between lattice mismatched semiconductor layers and restraining dislocations between {111} crystallographic planes of each cavity 10B. In this case, dislocations, if existing in the interlayer 2B, are restrained substantially in the space between adjacent cavities 10B. Accordingly, dislocations, if existing in the interlayer 2B, do not propagate into space above the cavities 10B. In some embodiments, if dislocations exist in the interlayer 2B and propagate into the spaces above the cavities 10B, the number of such dislocations is significantly smaller than the number of those dislocations restrained in the cavities 10B. Accordingly, the upper portion of the interlayer 2B is substantially free of dislocations. Thus, the upper layer 3B grown on the interlayer 2B is also substantially free of dislocations, allowing semiconductor devices or integrated circuits to be formed therein to have enhanced performance.

In some embodiments, the upper layer 3B can be omitted. In this case, the semiconductor substrate includes the base layer 1B and the layer 2B made of a material having a lattice constant different from that of the base layer 1B. Accordingly, the layer 2 is an exterior layer of the semiconductor substrate, and semiconductor devices or integrated circuits can be manufactured in or on the upper portion of the layer 2B.

Figure 26:
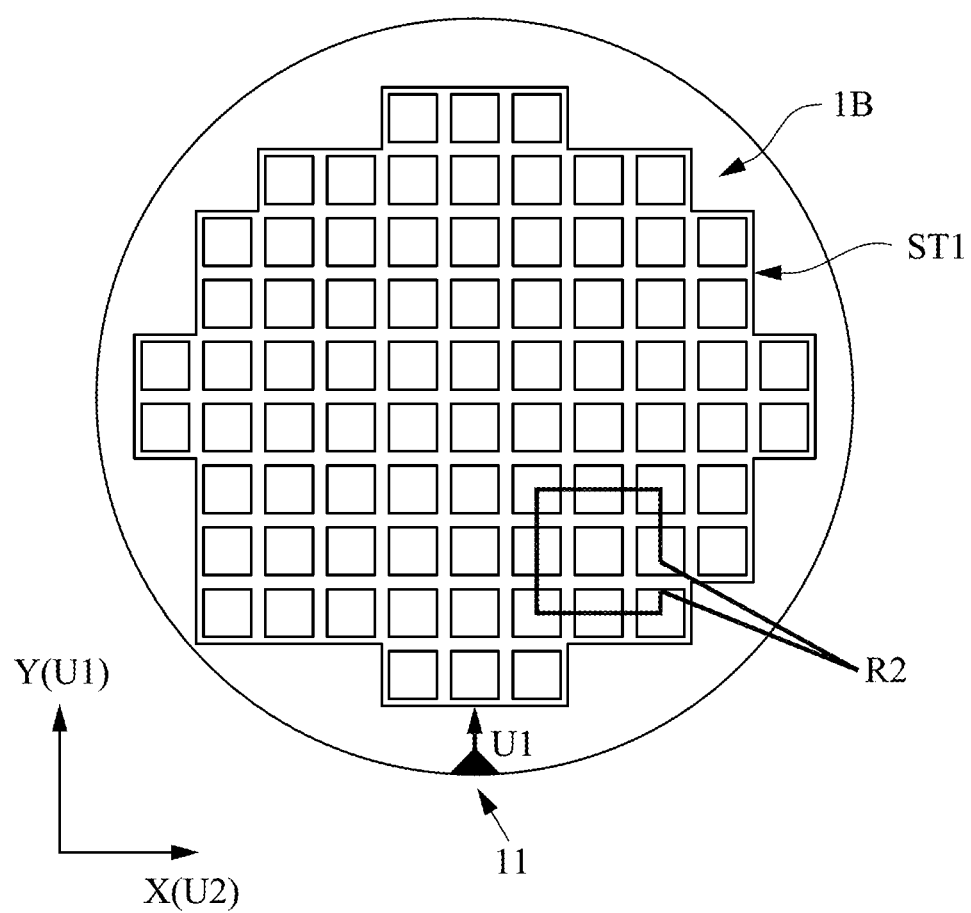
FIG. 26 shows a plan view of shallow trench isolation (STI) embedded in a base layer used to manufacture the cavities in the base layer, according to some embodiments of the present disclosure.
Figure 27:
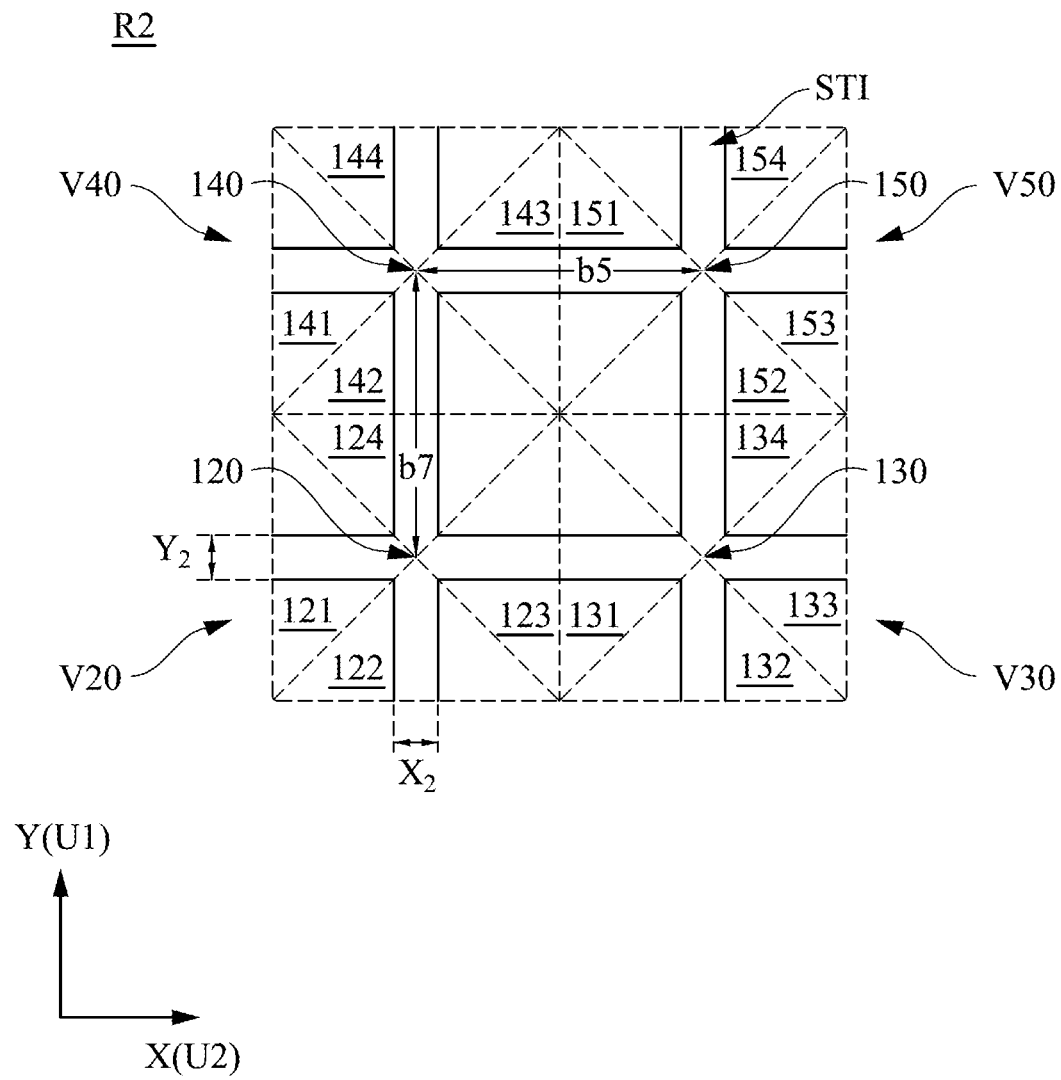
FIG. 27 shows a plan view of a portion of the STI in region R2 shown in FIG. 26.

FIG. 26 shows a plan view of STI embedded in the semiconductor substrate used to manufacture the above-described plurality of cavities, according to some embodiments of the present disclosure. FIG. 27 shows a plan view of a portion of the STI in region R2 shown in FIG. 26. For convenience of explanation, in FIG. 27, the portion of the STI in the region R2 are superimposed on the first to fourth cavities V20, V30, V40, and V50.

According to some embodiments, the STI is made of a material having a relatively higher etching resistance, as compared to an etching resistance of the base layer 1B, when an etching process such as a wet etching process is performed. In some embodiments, the STI is made of silicon oxide, silicon nitride, silicon oxynitride, a combination thereof, or any other suitable material. The STI can be formed by forming a shallow trench in the base layer 1B, filling an insulating material in the shallow trench, and planarizing the base layer 1B to remove extra insulating material disposed outside the shallow trench.

Referring to the drawings, the STI includes a plurality of bar-shaped patterns extending along X axis and a plurality of bar-shaped patterns extending along Y axis intersecting the plurality of patterns extending along X axis, according to some embodiments. According to some embodiments, a pitch of the bar-shaped patterns in X axis is the same as the first pitch b5 of the plurality of cavities 10B and a pitch of the bar-shaped patterns in Y axis is the same as the second pitch b7 of the plurality of cavities 10B.

In some embodiments, a width $X_2$ of each bar-shaped pattern extending along Y axis is about 1 nm to about 10 nm, and a width $Y_2$ of each bar-shaped pattern extending along X axis is about 1 nm to about 10 nm. In some embodiments, the width $X_2$ and the width $Y_2$ are equal to each other. The present disclosure, however, is not limited thereto.

According to some embodiments, in a case in which the base layer 1 is a (001) single crystal silicon and a germanium layer (i.e., a combined structure of the interlayer 2B and the upper layer 3B, or the layer 2B in a case in which the upper layer 3B is omitted) is epitaxially grown on the plurality of cavities 10B formed in the base layer 1B and has a thickness of about 1 (from the bottom of the cavities, i.e., from the plane Z2) in Z axis, a reduction of threading dislocation defect (TDD) is about $10^5$ cm$^{-2}$, as compared to an example in which a germanium layer having 200 nm to 2 µm is grown on a general silicon substrate without any cavities. For example, TDD of a 200 nm to 2 µm thick germanium layer grown on a general silicon substrate is about $10^7$ cm$^{-2}$, and on the other hand, TDD of a germanium layer having the same thickness grown on the cavities 10B of the base layer 1B according to some embodiments is about $10^2$ cm$^{-2}$, corresponding to a reduction of TDD of $10^5$.

In a case in which the width $X_2$ and the width $Y_2$ are the same as each other and the first pitch b5 and the second pitch b7 are the same as each other, a defect reduction ratio is equal to $x_2 \cdot b5 \cdot 1/(b5)^2 \cdot d$, in which d is merge defect factor, indicating a chance of defect existence in merged epitaxy corresponding to the region on a level above the STI. In some embodiments, d is equal to or less than about $10^{-3}$. When $X_2$ is about 1 nm to about 10 nm, b5 is about 50 nm to about 1000 nm, and d is equal to $10^{-3}$ according to design particulars, the defect reduction ratio can be designed to be about $10^{-2}$ to about $10^{-6}$, according to some embodiments.

FIGS. 28-32 show process steps of a method to manufacture the above-described semiconductor substrate, according to some embodiments. For convenience, FIGS. 28-32 illustrate cross-sectional views along line IV-IV' shown in FIG. 21.

Figure 28:
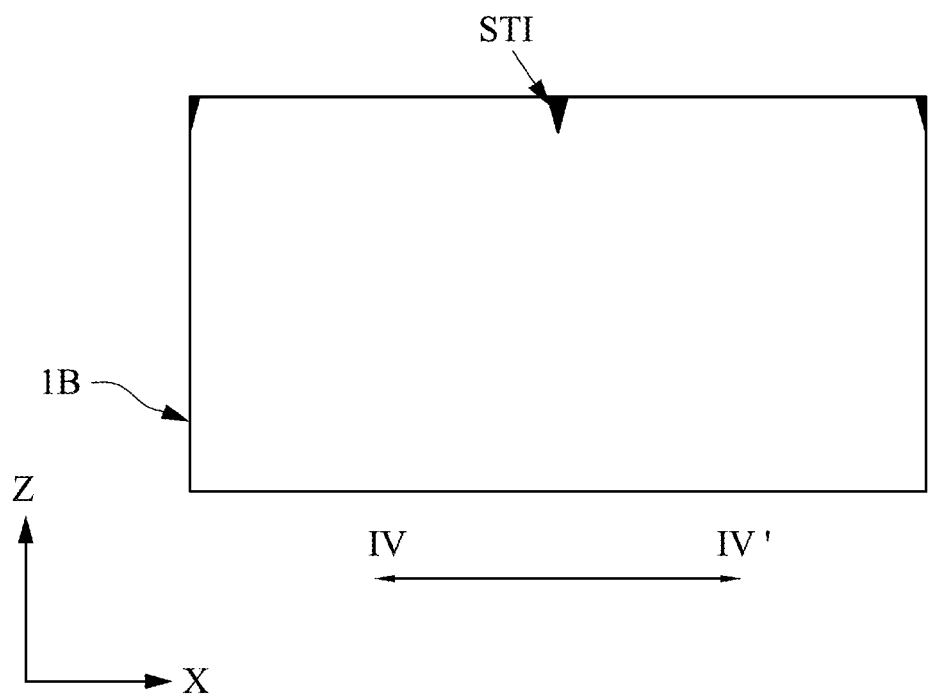
FIG. 28 shows a process step of a method to manufacture a semiconductor substrate, according to embodiments of the present disclosure.

Referring to FIG. 28, an STI is formed in the base layer 1B. The STI is made of a material having a relatively higher etching resistance, as compared to an etching resistance of the base layer 1B, when an etching process such as a wet etching process is performed. In some embodiments, the STI is made of silicon oxide, silicon nitride, silicon oxynitride, a combination thereof, or any other suitable material. The STI can be formed by forming a shallow trench in the base layer 1B, filling an insulating material in the shallow trench, and planarizing the base layer 1B to remove extra insulating material disposed outside the shallow trench. According to some embodiments, the base layer 1B includes, or consists essential of, silicon, germanium, or silicon germanium. In some embodiments, the base layer is a (001) silicon wafer, and [110] or [101] crystallographic direction thereof is aligned to a diameter of the silicon wafer crossing the notch of the silicon wafer. In some embodiments, an initial width of the STI can be designed to be greater than the width $X_2$ or $Y_2$ and an initial thickness of the STI can be designed to be greater than the thickness $t_2$ prior to an etching process to be described below. For example, the initial width of the STI can be about 5 nm to about 20 nm and the initial thickness of the STI can be about 10 nm to about 50 nm. The present disclosure, however, is not limited thereto.

Figure 29:
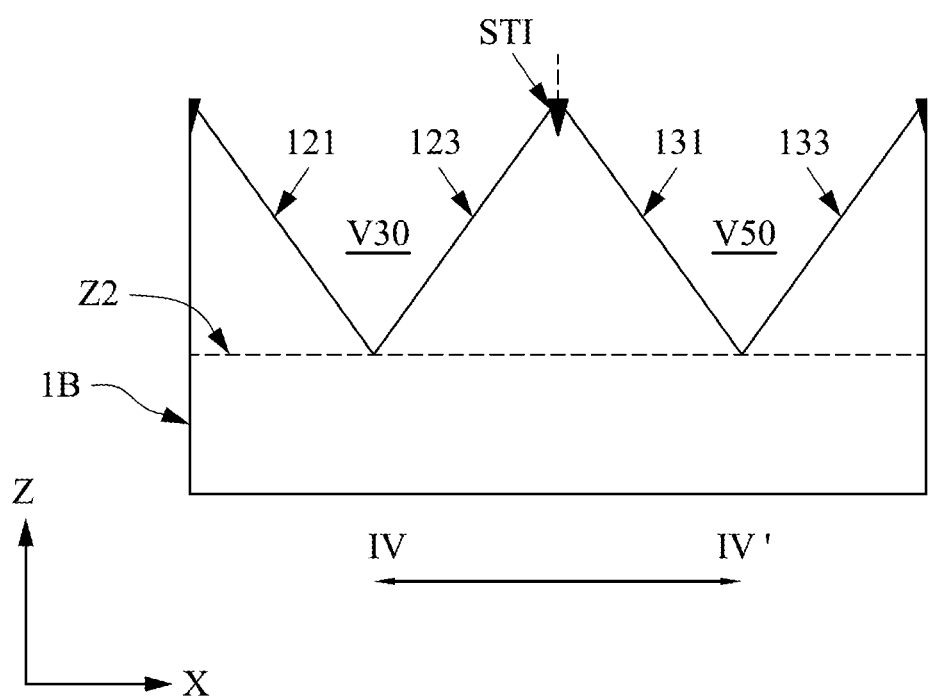
FIG. 29 shows a process step of a method to manufacture a semiconductor substrate, according to embodiments of the present disclosure.

Referring to FIG. 29, an etching process is performed by using the STI as an etching mask to etch portions of the base layer 1B in regions between adjacent STI. According to some embodiments, the etching process is a wet etching process using TMAH or KOH, although the present disclosure is not limited thereto. Since the base layer 1B is made of a crystal material such as a single crystal material, etching rates along different crystallographic directions or etching rates to different crystallographic planes are different from each other. In a case in which etching rates to (100), (110), and (111) crystallographic planes are m:n:o, m>n>o or m:n:o=1.0>0.5>0.05, and/or n>m>o or n:m:o=1.0>0.5>0.05 are satisfied. Thus, if the etching process is sufficiently performed, the etching stops when the chemical used to etch the base layer 1B meets {111} planes of the base layer 1B. In this case, the plurality of cavities, represented by the first and second cavities V20 and V30 in FIG. 29, are formed. Accordingly, the structure shown in FIG. 29 may not have (001) planes in the cavities V20 and V30. According to some embodiments, {111} planes of the same cavity converges at the bottom thereof.

Figure 30:
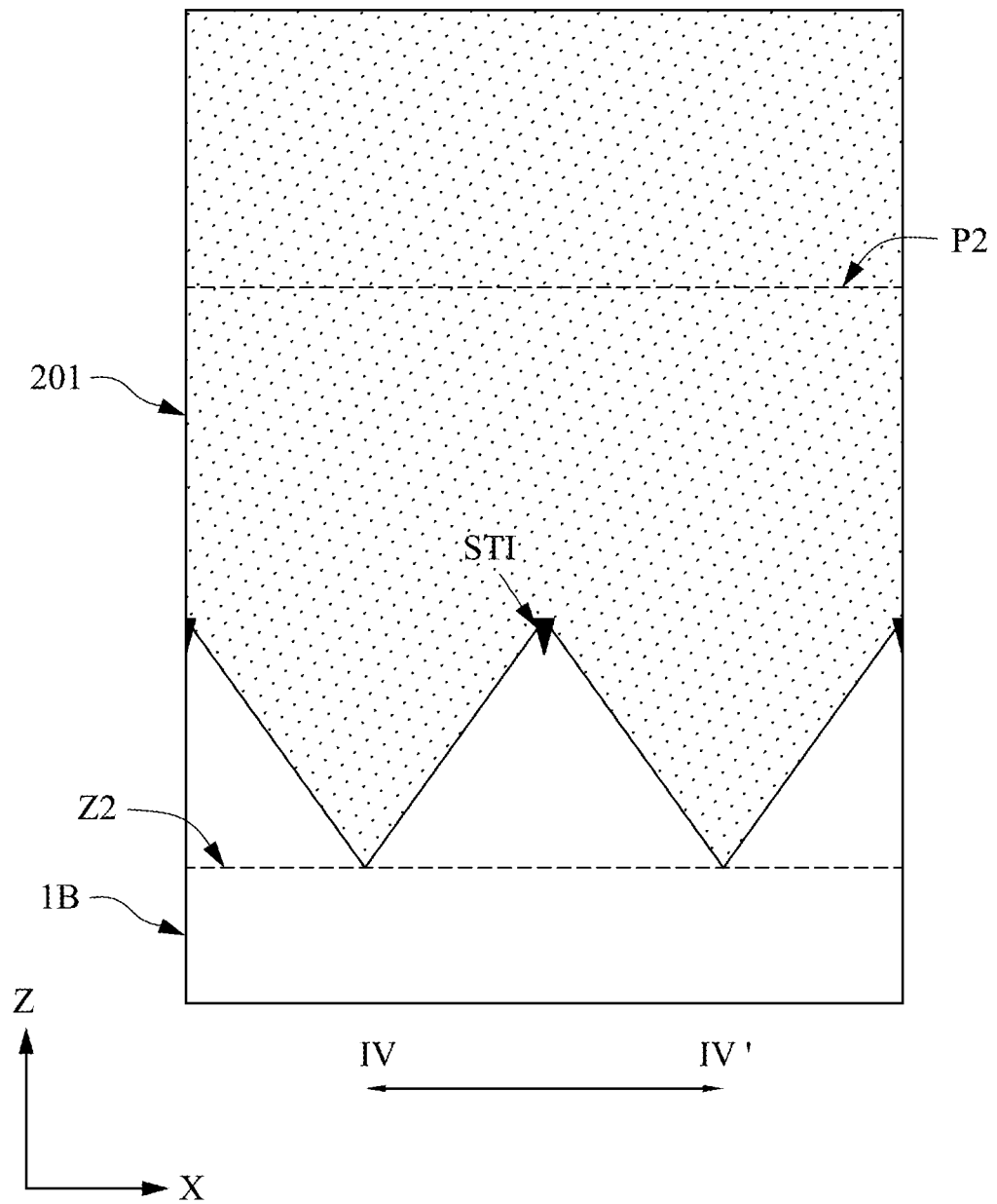
FIG. 30 shows a process step of a method to manufacture a semiconductor substrate, according to embodiments of the present disclosure.

Thereafter, referring to FIG. 30, an interim layer 201 is grown on the protrusions of the base layer 1B in any suitable epitaxial deposition system, including, but not limited to, atmospheric-pressure CVD (APCVD), low pressure CVD (LPCVD), ultra-high-vacuum CVD (UHVCVD), by molecular beam epitaxy (MBE), or by atomic layer deposition (ALD). In the CVD process, epitaxial growth typically includes introducing a source gas into the chamber. The source gas can include at least one precursor gas and a carrier gas, such as hydrogen. The reactor chamber is heated, such as, by RF-heating. The growth temperature in the chamber ranges from about 350° C. to about 550° C. and the pressure in the chamber ranges from about 100 Torr to about bout 500 Torr, depending on the composition of the first interim layer 201. The epitaxial growth system can also utilize low-energy plasma to enhance the layer growth kinetics. The epitaxial growth system can be a single-wafer or multiple-wafer batch reactor.

According to some embodiments, the interim epitaxial layer 201 is grown directly on the {111} planes of base layer 1B. According to some embodiments, the interim layer 201 is sufficiently grown such that the interim layer 201 not only covers the {111} planes but also allows respective portions of the interim layer 201 filling the cavities in the base layer 1B to merge on the base layer 1B.

According to some embodiments, an annealing process is performed to the interim layer 201 to annihilate damage and defects and/or crystalize the interim layer 201. The annealing is performed, for example, from a temperature from 600° C. to about 900° C. in a vacuum chamber having a pressure from about 1 Torr to about 10 Torr for about 100 seconds to about 600 seconds.

Figure 31:
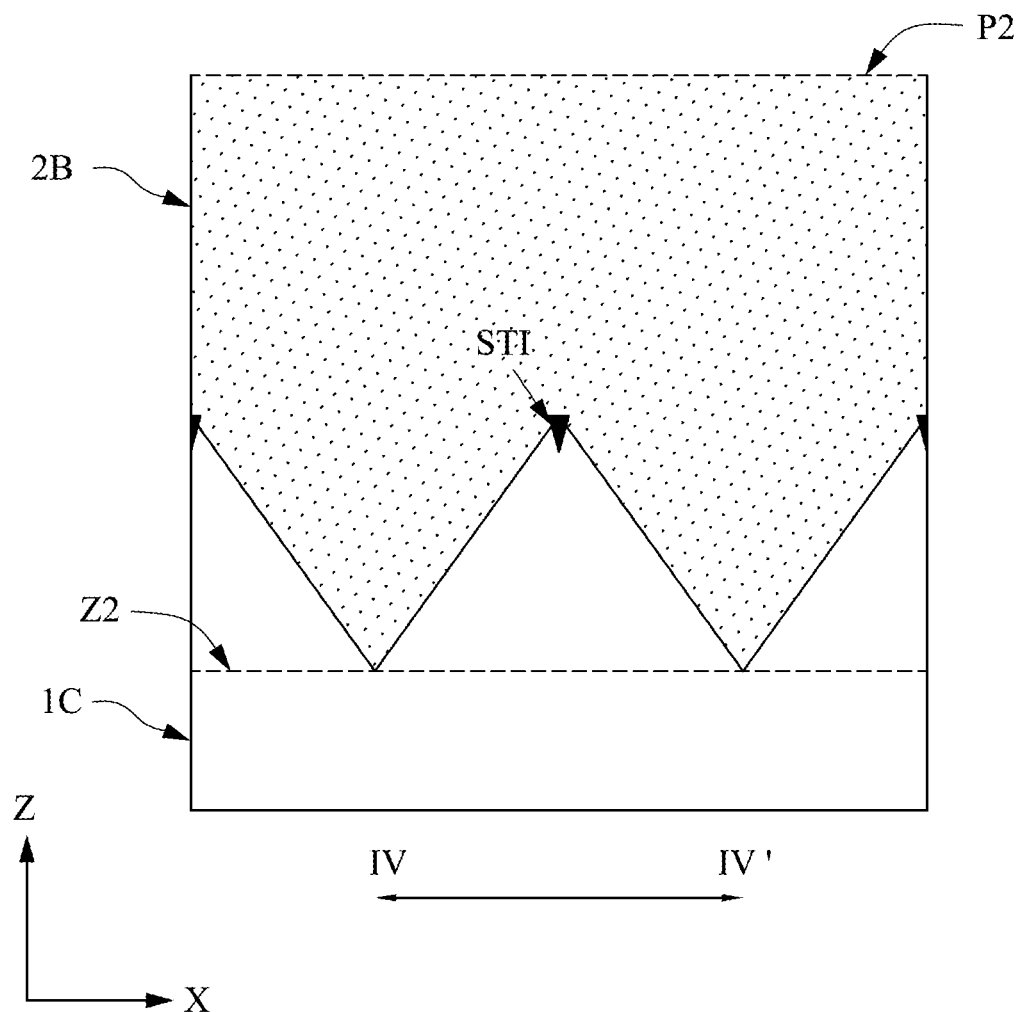
FIG. 31 shows a process step of a method to manufacture a semiconductor substrate, according to embodiments of the present disclosure.

Now referring to FIG. 31, a planarization process such as a CMP is performed to the interim layer 201 to obtain a planarized surface suitable to regrow additional layer(s) such as the upper layer 3B in one of the above-described epitaxial deposition systems. In this case, the interim layer 201 is reduced to a level of an intermediate plane P2 by the planarization process. In some embodiments, the interim layer 201 is converted to the interlayer 2B by the planarization process.

Figure 32:
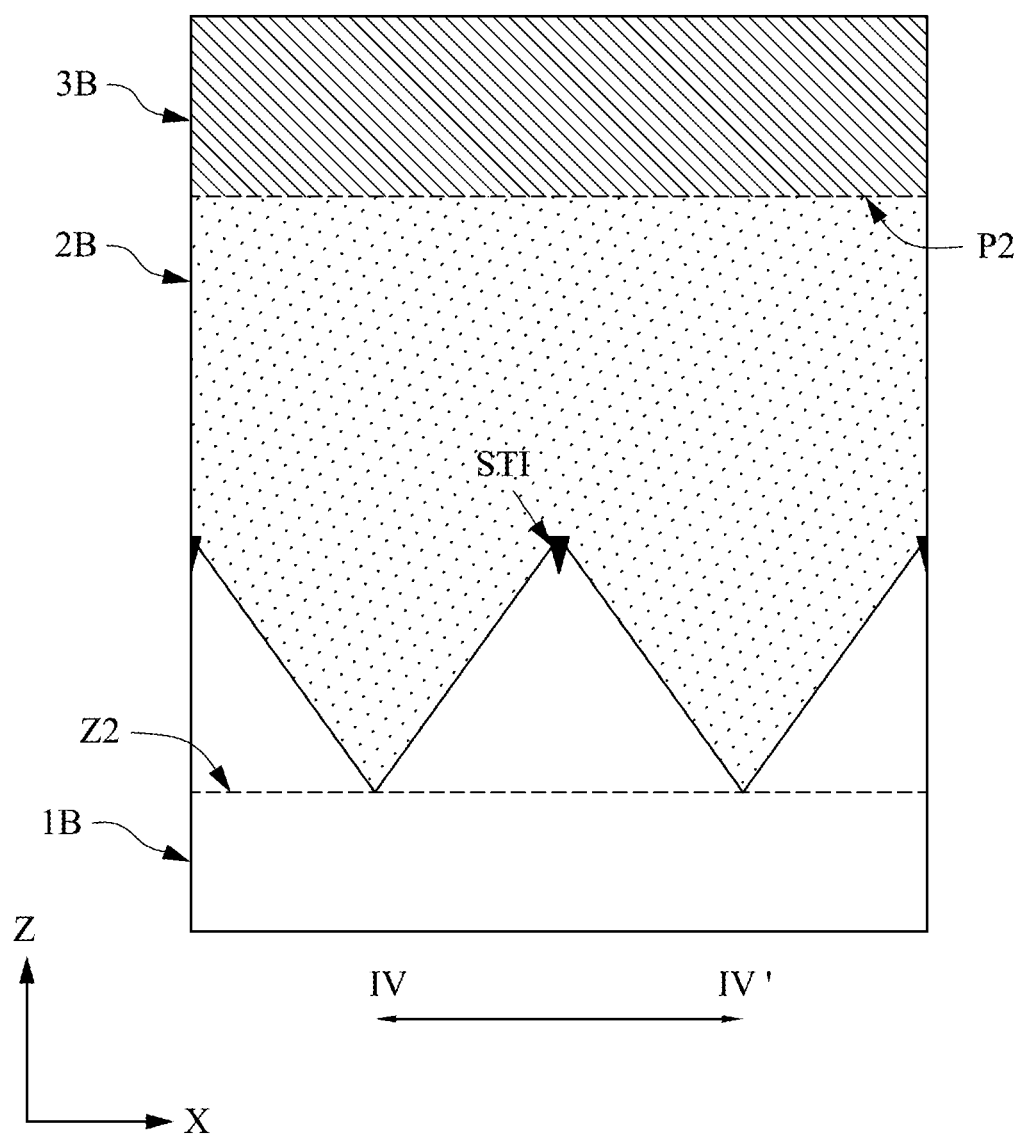
FIG. 32 shows a process step of a method to manufacture a semiconductor substrate, according to embodiments of the present disclosure.

Next, as shown in FIG. 32, the upper layer 3B is grown on the interlayer 2B in one of the above-described epitaxial deposition systems. According to some embodiments, the recipe to grow the upper layer 3B is the same as that used to grow the interim layer 201, although duration to form the upper layer 3B can be different from that to form the interim layer 201.

Although not shown, another planarization process such as a CMP can be optionally performed to the upper layer 3B, according to design particulars.

In other embodiments, the process step shown in FIG. 32 can be omitted. In this case, the upper portion of the remaining portion 201 (i.e., the upper portion of the layer 2B) after planarization process can be used to manufacture semiconductor devices or integrated circuits.

According to some embodiments, the dislocation propagation pattern helps releasing the strain between lattice mismatched semiconductor layers and restraining dislocations inside a region interposed between two crystallographic planes made by a method according to some embodiments. In this case, dislocations, if existing in an epitaxially grown layer on a base layer, are restrained substantially in the space between the crystallographic planes of the base layer. Accordingly, dislocations, if existing in the epitaxially grown layer, will not propagate into space above the base layer. Even if dislocations exist in epitaxially grown layer and propagate into the spaces above the base layer, the number of such dislocations is significantly smaller than the number of those dislocations restrained the crystallographic planes of the base layer. Accordingly, the upper portion of the epitaxially grown layer is substantially free of dislocations, allowing semiconductor devices or integrated circuits to be formed thereon or therein to have enhanced performance.

According to some embodiments, a reduction of threading dislocation defect (TDD) in an epitaxially grown layer on a base layer having structures such as protrusions or cavities is about $10^5$ cm$^{-2}$, as compared to an example in which an epitaxially grown layer on a base layer without protrusions or cavities. Accordingly, semiconductor devices or integrated circuits made of the epitaxially grown layer according to embodiments of the present disclosure can have improved performance.

In one embodiment, a semiconductor substrate includes a first material layer made of a first material and including a plurality of protrusions, wherein each of the protrusions includes a tip and a plurality of facets converging at the tip, and adjacent facets of adjacent protrusions are in contact with each other, and a second material layer made of a second material different from the first material, filling spaces between the plurality of protrusions, and covering the plurality of protrusions. In one embodiment, the second material layer is in direct contact with the plurality of facets of the plurality of protrusions. In one embodiment, the first material is crystal silicon, each facet is a {111} plane of the crystal silicon, and the second material is one of germanium, silicon germanium, gallium arsenide, aluminum antimonide, indium aluminum antimonide, indium antimonide, indium arsenide, indium phosphide, and gallium nitride. In one embodiment, each protrusion has a pyramid shape. In one embodiment, the plurality of protrusions are arranged in an array in a first direction and in a second direction perpendicular to the first direction, and a pitch of the plurality of protrusions in the first direction and in the second direction is from 50 nm to 1000 nm. In one embodiment, the first material layer is a (001) silicon wafer having the plurality of protrusions arranged in an array in a first direction and in a second direction perpendicular to the first direction, an angle between the first direction and a [110] crystallographic direction of the silicon wafer is about 43° to about 47°, and an angle between the second direction and a [101] crystallographic direction of the silicon wafer is about 43° to about 47°, and the second material is one of germanium, silicon germanium, gallium arsenide, aluminum antimonide, indium aluminum antimonide, indium antimonide, indium arsenide, indium phosphide, and gallium nitride. In one embodiment, the first material layer is a (110) silicon wafer having the plurality of protrusions arranged in an array in a [110] crystallographic direction of the silicon wafer and in a [101] crystallographic direction of the silicon wafer, and the second material is one of germanium, silicon germanium, gallium arsenide, aluminum antimonide, indium aluminum antimonide, indium antimonide, indium arsenide, indium phosphide, and gallium nitride.

In one embodiment, a semiconductor substrate includes a first material layer made of a first material and including a plurality of cavities, wherein each of the cavities has a reverse-pyramid shape and a plurality of facets converging at a bottom of the reverse-pyramid shape, and adjacent cavities are separated from each other by an insulating layer embedded in the first material layer; and a second material layer made of a second material different from the first material, filling the plurality of cavities, and covering the insulating layer. In one embodiment, the second material layer is in direct contact with the plurality of facets of the plurality of cavities. In one embodiment, the first material is crystal silicon, each facet is a {111} plane of the crystal silicon, and the second material is one of germanium, silicon germanium, gallium arsenide, aluminum antimonide, indium aluminum antimonide, indium antimonide, indium arsenide, indium phosphide, and gallium nitride. In one embodiment, the semiconductor substrate further includes an insulating layer disposed between the plurality of cavities, the plurality of cavities are arranged in an array in a first direction and in a second direction perpendicular to the first direction, and a pitch of adjacent patterns of the insulating layer in the first direction and in the second direction is from 50 nm to 1000 nm. In one embodiment, a pattern of the insulating layer has a triangular shape in a plane perpendicular to one of the first direction and second direction and passing through one or more of the plurality of cavities. In one embodiment, the first material layer is a (001) silicon wafer having the plurality of cavities arranged in an array in a [110] crystallographic direction of the silicon wafer and in a [101] crystallographic direction of the silicon wafer, and the second material is one of germanium, silicon germanium, gallium arsenide, aluminum antimonide, indium aluminum antimonide, indium antimonide, indium arsenide, indium phosphide, and gallium nitride.

In one embodiment, a method for manufacturing a semiconductor substrate includes forming an etching mask layer in or on a first material layer, wherein the first material layer has a first crystallographic plane exteriorly exposed, performing an anisotropic etching process to etch portions of the first material layer not covered by the etching mask layer so as to remove the exteriorly exposed first crystallographic plane, such that the first material layer provides a plurality of second crystallographic planes exposed by the anisotropic etching process, and forming, on the plurality of second crystallographic planes of the first material layer, a second material having a lattice constant different from that of the first material layer. In one embodiment, the method further includes planarizing the second semiconductor material to convert the remaining second material to a second material layer. In one embodiment, the method further includes a third material layer made of the second material on the second material layer. In one embodiment, the etching mask layer includes a plurality of patterns spaced-apart from each other and disposed on the first material layer, and the anisotropic etching process converts an upper portion of the first material layer to a plurality of protrusions. In one embodiment, the etching mask layer includes an insulating layer embedded in the first material layer, and the anisotropic etching process converts an upper portion of the first material layer to a plurality of cavities. In one embodiment, the first material is crystal silicon, the plurality of second crystallographic planes are (111) planes of crystal silicon, and the second material is one of germanium, silicon germanium, gallium arsenide, aluminum antimonide, indium aluminum antimonide, indium antimonide, indium arsenide, indium phosphide, and gallium nitride. In one embodiment, the method further includes performing an annealing process to the second material.

The term "embodiment" or "embodiments" described above does not refer to the same embodiment or the same embodiments, and is provided to emphasize a particular feature or characteristic different from that of other embodiment or embodiments. One of ordinary skill in the art should understand that "embodiment" or "embodiments" described above can be considered to be able to be implemented by being combined in whole or in part with one another, unless an opposite or contradictory description is provided.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor substrate, the method comprising:
    forming an etching mask layer in or on a first material layer, wherein the first material layer has a first crystallographic plane exteriorly exposed;
    performing an anisotropic etching process to etch portions of the first material layer not covered by the etching mask layer so as to remove the exteriorly exposed first crystallographic plane, such that the first material layer provides a plurality of second crystallographic planes exposed by the anisotropic etching process,
    wherein the second crystallographic planes form protrusions, each protrusion having rhombus-shaped facets meeting at a tip; and forming, on the plurality of second crystallographic planes of the first material layer, a second material layer having a lattice constant different from that of the first material layer.

2. The method according to claim 1, further comprising planarizing the second material layer.

3. The method of claim 2, further comprising forming a third material layer made of a same material as the second material layer on the second material layer.

4. The method of claim 1, wherein:
the etching mask layer includes a plurality of patterns spaced-apart from each other and disposed on the first material layer, and
the anisotropic etching process converts an upper portion of the first material layer to a plurality of protrusions.

5. The method of claim 1, wherein:
the etching mask layer includes an insulating layer embedded in the first material layer, and
the anisotropic etching process converts an upper portion of the first material layer to a plurality of cavities.

6. The method of claim 1, wherein:
the first material layer comprises crystal silicon,
the plurality of second crystallographic planes are (111) planes of crystal silicon, and
the second material is one of germanium, silicon germanium, gallium arsenide, aluminum antimonide, indium aluminum antimonide, indium antimonide, indium arsenide, indium phosphide, and gallium nitride.

7. The method of claim 1, further comprising annealing the second material layer.

8. A method, comprising:
forming a patterned mask layer over a first material layer, wherein the patterned mask layer comprises a plurality of patterns, and has a higher etching resistance than the first material layer;
wet etching portions of the first material layer to provide a plurality of crystallographic planes in the first material layer converging at a point below one of the plurality of patterns,
wherein the plurality of crystallographic planes converging at the point below one of the plurality of patterns are rhombus-shaped; and
forming a second material layer over the plurality of crystallographic planes of the first material layer,
wherein the second material layer has a lattice constant different from that of the first material layer.

9. The method according to claim 8, further comprising forming a third material layer over the second material layer.

10. The method according to claim 9, further comprising planarizing the second material layer before forming the third material layer.

11. The method according to claim 8, wherein the patterned mask layer comprises silicon oxide, silicon nitride, or silicon oxynitride.

12. The method according to claim 8, wherein the first material layer comprises Si, Ge, or SiGe.

13. The method according to claim 8, wherein the second material layer is different than the first material layer and the second material layer comprises Si, Ge, SiGe, GaAs, AlSb, InSb, InAs, InP, GaN, or indium aluminum antimonide.

14. The method according to claim 8, further comprising performing an annealing process after forming the second material layer.

15. A method, comprising:
forming a layer of mask material over a first material layer;
forming an array of uniformly shaped and spaced mask patterns in the layer of mask material,
wherein the mask patterns have a higher etching resistance than the first material layer;
etching the first material layer using the mask patterns as etching masks to provide a plurality of projections in the first material layer, wherein each projection has an uppermost point below a corresponding mask pattern, and each projection comprises a plurality of rhombus-shaped facets meeting at the uppermost point; and
forming a second material layer over the plurality of projections,
wherein the second material layer has a lattice constant different from that of the first material layer.

16. The method according to claim 15, wherein the mask patterns are rectangular-shaped.

17. The method according to claim 15, further comprising heating the second material layer at temperature ranging from 600° C. to about 900° C. at a pressure from about 1 Torr to about 10 Torr.

18. The method according to claim 15, further comprising forming a third material layer over the second material layer.

19. The method according to claim 18, further comprising planarizing the second material layer before forming the third material layer.

20. The method according to claim 15, wherein the mask layer material comprises silicon oxide, silicon nitride, or silicon oxynitride, and the first material layer comprises Si, Ge, or SiGe.

* * * * *